United States Patent
Fang et al.

(10) Patent No.: US 11,126,089 B2
(45) Date of Patent: Sep. 21, 2021

(54) METHOD FOR DETERMINING CORRECTIONS TO FEATURES OF A MASK

(71) Applicant: ASML NETHERLANDS B.V., Veldhoven (NL)

(72) Inventors: Wei Fang, Milpitas, CA (US); Lingling Pu, San Jose, CA (US); Zhichao Chen, San Jose, CA (US); Haili Zhang, San Jose, CA (US); Pengcheng Zhang, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/848,724

(22) Filed: Apr. 14, 2020

(65) Prior Publication Data

US 2020/0326632 A1     Oct. 15, 2020

Related U.S. Application Data

(60) Provisional application No. 62/833,958, filed on Apr. 15, 2019.

(51) Int. Cl.
   *G03F 7/20*        (2006.01)
   *G03F 1/36*        (2012.01)

(52) U.S. Cl.
   CPC ............ *G03F 7/70441* (2013.01); *G03F 1/36* (2013.01); *G03F 7/705* (2013.01); *G03F 7/7065* (2013.01);
   (Continued)

(58) Field of Classification Search
   CPC .......... G03F 1/36; G03F 1/84; G03F 7/70441; G03F 7/705; G03F 7/70508;
   (Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| TW | 200720838 | 6/2007 |
| WO | 2010059954 | 5/2010 |

OTHER PUBLICATIONS

Spence, C.: "Full-Chip Lithography Simulation and Design Analysis—How OPC is Changing IC Design", Proc. of SPIE, vol. 5751, pp. 1-14, 2005.

(Continued)

*Primary Examiner* — Christina A Riddle
(74) *Attorney, Agent, or Firm* — Pillsbury Winthrop Shaw Pittman LLP

(57) ABSTRACT

A method for determining corrections to features of a mask. The method includes obtaining (i) a pattern group for a design layout, and (ii) defect inspection data of a substrate imaged using the mask used in the patterning process for the design layout; determining, based on the defect inspection data, a defect map associated with the pattern group, wherein the defect map comprises locations of assist features having a relatively higher probability of being printed on the substrate compared to other patterns of the design layout; and determining, via simulating an optical proximity correction process using data associated with the defect map, corrections to the features of the mask.

20 Claims, 20 Drawing Sheets

(52) U.S. Cl.
CPC ...... *G03F 7/70508* (2013.01); *G03F 7/70625* (2013.01)

(58) Field of Classification Search
CPC ............... G03F 7/70625; G03F 7/7065; G03F 7/70491–70541; G03F 7/70616–70683; G03F 7/70425–70441
USPC ........ 355/30, 52–55, 67–77; 716/30, 50–56; 250/492.1, 492.2, 492.22; 403/5, 22, 30; 430/5, 22, 30
See application file for complete search history.

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 6,456,736 | B1 * | 9/2002 | Su ...................... G03F 7/70625 348/126 |
| 7,587,704 | B2 | 9/2009 | Ye et al. |
| 8,458,626 | B1 | 6/2013 | Tirapu-Azpiroz et al. |
| 2003/0023939 | A1 | 1/2003 | Pierrat et al. |
| 2005/0076322 | A1 | 4/2005 | Ye et al. |
| 2007/0035728 | A1 | 2/2007 | Kekare et al. |
| 2009/0157360 | A1 | 6/2009 | Ye et al. |
| 2010/0070944 | A1 | 3/2010 | Wu et al. |
| 2010/0315614 | A1 | 12/2010 | Hansen |
| 2012/0198404 | A1 * | 8/2012 | Hasebe ................ G03F 7/7065 716/112 |
| 2015/0154746 | A1 | 6/2015 | Zafar et al. |
| 2016/0313651 | A1 | 10/2016 | Middlebrooks et al. |
| 2019/0004418 | A1 | 1/2019 | Jeong |
| 2019/0094680 | A1 | 3/2019 | Huang et al. |

OTHER PUBLICATIONS

Cao, Y. et al.: "Optimized Hardware and Software for Fast, Full Chip Simulation", Proc. of SPIE, vol. 5754, 2005.
Rosenbluth A. et al.: "Optimum Mask and Source Patterns to Print a Given Shape", Journal of Microlithography, Microfabrication, Microsystems ,1(1), pp. 13-20, 2002.
Granik: "Source Optimization for Image Fidelity and Throughput", Journal of Microlithography, Microfabrication, Microsystems 3(4), pp. 509-522, Oct. 2004.
Socha R. et al.: "Simultaneous Source Mask Optimization (SMO)", Proc. of SPIE, vol. 5853, 2005.
International Search Report issued in corresponding PCT Patent Application No. PCT/EP2020/058491, dated Jul. 6, 2020.
Taiwanese Office Action issued in corresponding Taiwanese Patent Application No. 109112475, dated Feb. 22, 2021.

* cited by examiner

METHOD FOR DETERMINING CORRECTIONS TO FEATURES OF A MASK

This application claims the benefit of priority of U.S. patent application No. 62/833,958, filed on Apr. 15, 2019, which is incorporated herein in its entirety by reference.

TECHNICAL FIELD

The description herein relates to lithographic apparatuses and processes, and more particularly to a tool to determine corrections to a patterning device based on defects or variations in printed patterns e.g., in resist layer.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting or projecting radiation from the source before the radiation passes the patterning device, or optical components for shaping, adjusting or projecting the radiation after the radiation passes the patterning device. The projection optics generally exclude the source and the patterning device.

BRIEF SUMMARY

Sub-resolution assist feature (SRAF) is an important feature of a mask used in advanced lithography to improve pattern printability, process window optimization, or other aspects of a patterning process. The present disclosure provides a method for improving SRAF design (or OPC in general). The method generates defect data associated with the SRAF printed on the substrate and provides optimization of SRAFs based on such defect data. Further, a variation band for primary patterns is determined based on metrology data. The defect data represents the probability of the SRAF occurrence at a specific location, the variation band quantifies the variations in a printed pattern. Such information when used with patterning process simulations can improve the accuracy and efficiency of SRAF design in lithography process.

According to an embodiment, there is provided a method for determining corrections to features of a mask. The method includes obtaining (i) a pattern group for a design layout, and (ii) defect inspection data of a substrate imaged using the mask used in the patterning process for the design layout; determining, based on the defect inspection data, a defect map associated with the pattern group, wherein the defect map comprises locations of assist features having a relatively higher probability of being printed on the substrate compared to other patterns of the design layout; and determining, via simulating an optical proximity correction process using data associated with the defect map, corrections to the features of the mask.

In an embodiment, the determining the defect map involves identifying a plurality of printed instances of the pattern group within the defect inspection data; detecting assist features across the plurality of printed instances of the pattern group; defining a grid for a printed instance of the plurality of printed instances of the pattern group; and determining, based on a location on the grid, a probability of occurrence of assist features at the location of the pattern group.

In an embodiment, the determining of the probability occurrence of assist features at the location involves aligning the plurality of printed instances of the pattern group, identifying a total number of assist features printed at the location on the grid of the printed pattern associated with the aligned plurality of printed instances, wherein the total number of the assist features printed at the location on the grid includes a total number of assist features detected, across the plurality of printed instances, at locations that correspond to the location on the grid, and determining the probability of occurrence of the assist features at the location on the grid, wherein the probability is determined based on the total number of the assist features printed or the total number of assist features detected.

In an embodiment, the probability of occurrence is determined based on a size of one or more assist feature at a particular location on the grid, where a selected assist feature is at the particular location on the grid when the selected assist feature is at a location, across the plurality of printed instances, that corresponds to the particular location on the grid. In an embodiment, the location is a region within the pattern group.

In an embodiment, the method further involves obtaining metrology data of the substrate imaged using the mask used in the patterning process for the design layout; determining, based on the metrology data, a variation of a metric associated with the pattern group; and determining, via simulating an optical proximity correction process using data associated with the variation of the metric and the defect map, corrections to the features of the mask.

In an embodiment, the determining of the variation of the metric involves identifying a plurality of printed instances of the pattern group within the metrology data; aligning the plurality of printed instances of the pattern group; and determining the variation of the metric associated with the pattern group.

In an embodiment, the metric is a critical dimension, line edge roughness, or a geometric property associated with a feature of the pattern group. In an embodiment, the metrology data is obtained via a metrology tool. In an embodiment, the metrology tool is a scanning electron microscope (SEM) and the metrology data is statistics obtained from a SEM image. In an embodiment, the statistic is at least one of: a distribution of critical dimension (CD) values associated with the pattern group, a standard deviation of CD values associated with the pattern group, an edge variation band width associated with the pattern group, or a three-sigma variation of line roughness associated with the pattern group.

Furthermore, in an embodiment, there is provided a computer program product comprising a non-transitory computer readable medium having instructions recorded thereon, the instructions when executed by a computer implementing the method of any of the above claims.

BRIEF DESCRIPTION OF THE DRAWINGS

Embodiments will now be described, by way of example only, with reference to the accompanying drawings in which.

Figure 1:
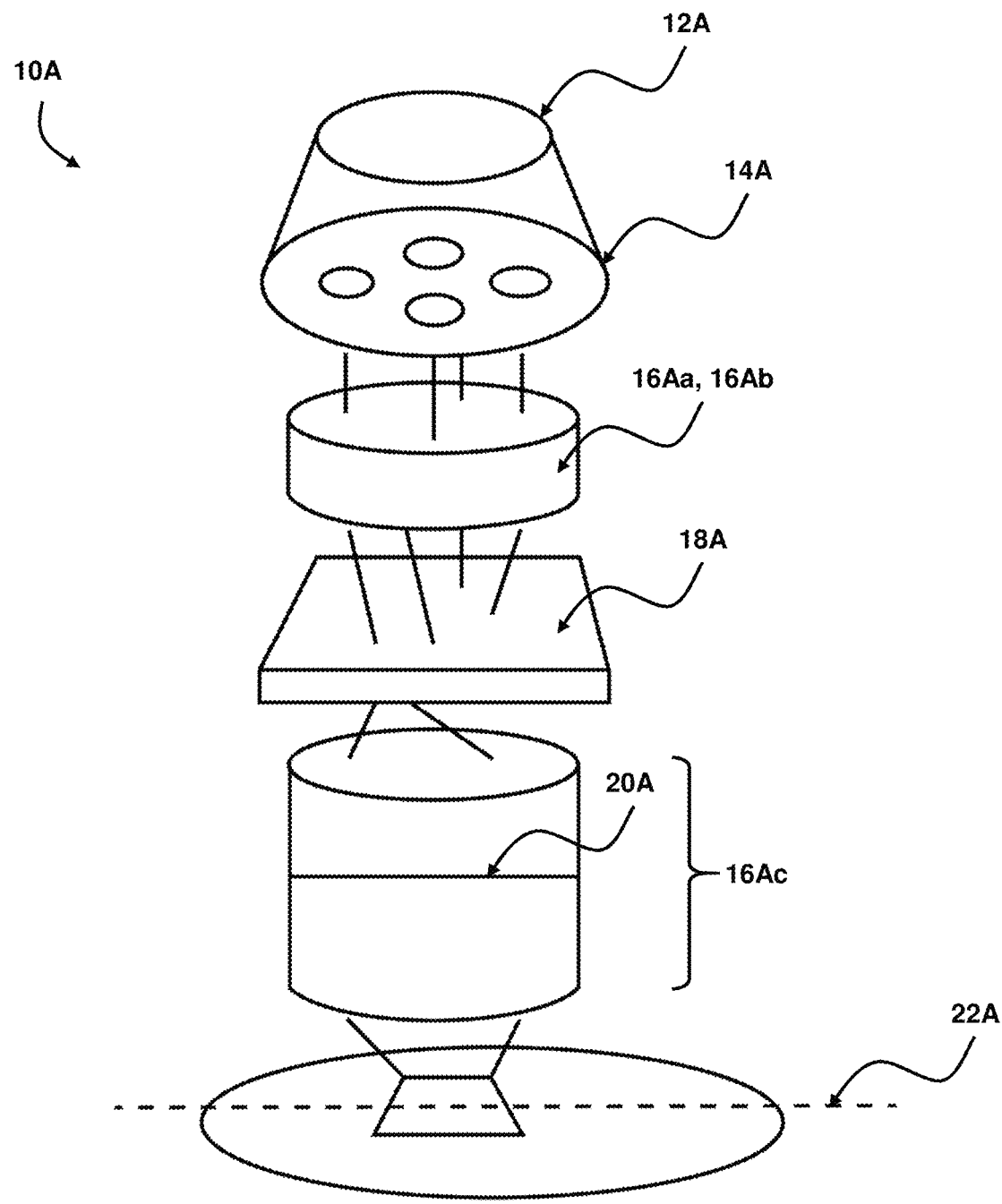
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. In some cases where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Today computer chip or other integrated circuits include patterns that are extremely complex having structures with extremely small size (e.g., less than 10 nm). For manufacturing such complex structures of the chip, advanced lithography process is used. Advanced lithography process is a complex and time-consuming process. Errors in even one step (e.g., a mask pattern design) can have the potential to result in defects in the final IC. The goal of a manufacturing process (e.g., using a lithographic apparatus) is to minimize defects in the final IC thereby improving the overall yield of the process.

In an aspect of the advanced lithography, computational process models are used to modify a design layout or target patterns therein to generate a mask layout so that a printed pattern is imaged as close as possible to a target pattern. For example, the mask layout is generated via an optical proximity correction (OPC) process. The OPC process may cause changes in the geometry of a primary pattern of the design layout or inclusion of additional features such as sub-resolution assist feature (SRAF). SRAFs are important elements of a mask for advanced lithography to improve pattern printability process window optimization, and other aspects of the patterning process.

Conventional SRAF generation or design is based on modeling or rules. However, non-optimal SRAF generation may result in a pattern (e.g., a shape) being mistakenly printed on the wafer, resulting in a defect that may cause a deviation from a target pattern shape, size, etc. So, adjustments may be needed to SRAF rules or models used therefor. Adjusting SRAF rules or modeling to avoid unintended printing and achieve maximum process window associated with the target pattern can be very challenging.

The present disclosure provides, for example, methods for improving SRAF design or optical proximity correction for a mask so that printed patterns on the substrate are within a defect specification (e.g., no defects, 99.9% yield, etc.). To reduce defects, a defect inspection is performed on a previously printed substrate and defect data is associated with a defect (e.g., SRAF) printed on the substrate. The defect data can be further provided to simulate a patterning process for optimizing of SRAFs design, mask design, source design, etc. The defect data represents the probability of a defect occurrence at a specific location on the substrate. Also, metrology data associated with the primary patterns printed on the substrate may be obtained via a metrology tool. Using the metrology data, a variation band for primary patterns can determined. The variation band quantifies the variations in the printed pattern that may result in a defect. In this way, using defect or variation band information the patterning process simulations can be performed to improve the accuracy and efficiency of the lithography process.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm). As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

The term "optimizing" and "optimization" as used herein mean adjusting a lithographic projection apparatus such that results or processes of lithography have more desirable characteristics, such as higher accuracy of projection of design layouts on a substrate, larger process windows, etc.

Further, the lithographic projection apparatus may be of a type having two or more substrate tables (or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin ($\Theta_{max}$).

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges or be interdependent due to practicalities of implementations of the system. In case of a lithographic projection apparatus, the constraints are often associated with physical properties and characteristics of the hardware such as tunable ranges, or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
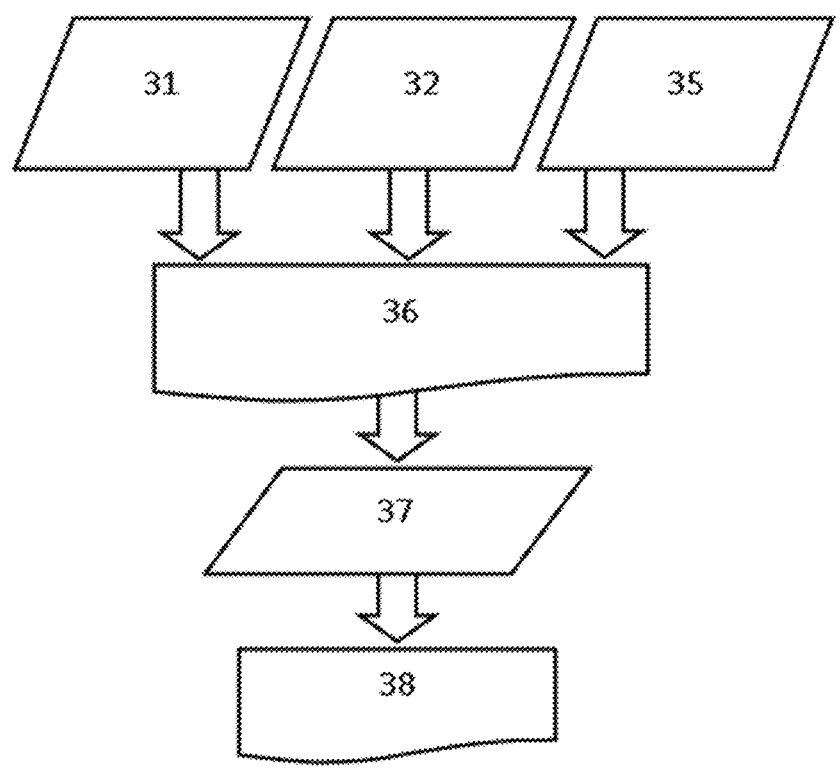
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution or phase distribution) of the source. A projection optics model 32 represents optical characteristics (including changes to the radiation intensity distribution or the phase distribution caused by the projection optics) of the projection optics. A design layout model 35 represents optical characteristics (including changes to the radiation intensity distribution or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

In an embodiment, the design layout is modified via an optical proximity correction process to generate a mask layout so that a printed pattern is imaged as close as possible to a target pattern. The OPC process may cause changes in the geometry of a primary pattern of the design layout or inclusion of additional features such as sub-resolution assist feature (SRAF). SRAFs are important elements of a mask for advanced lithography to improve pattern printability process window optimization, and other aspects of the patterning process. Typically, generation of SRAF is based on modeling or rules. However, non-optimal SRAF generation results in a pattern (e.g., a shape) being mistakenly printed on the wafer, resulting in a defect that may cause a deviation from a target pattern shape, size, etc. So, adjustments may be needed to SRAF rules or models used therefor. Adjusting SRAF rules or modeling to avoid unintended printing and achieve maximum process window associated with the target pattern can be very challenging.

The present disclosure provides, among others, a method wherein heat maps (or defect maps) are generated based on defect inspection results. The defect inspection results comprises defect data, such as SRAF, being printed on the substrate, such as a SRAF shape being printed on one of multiple metal layers that are stacked on the substrate. Furthermore, from measurement data of a printed pattern, a variation band is generated related to primary features. The defect map represents a probability of a SRAF defect occurrence at a specific location on a wafer, and the variation band quantifies the variation of a printed pattern. One of the advantages of such defect maps and variation bands is that it improves accuracy and efficiency of SRAF design in lithography process.

Figure 3A:
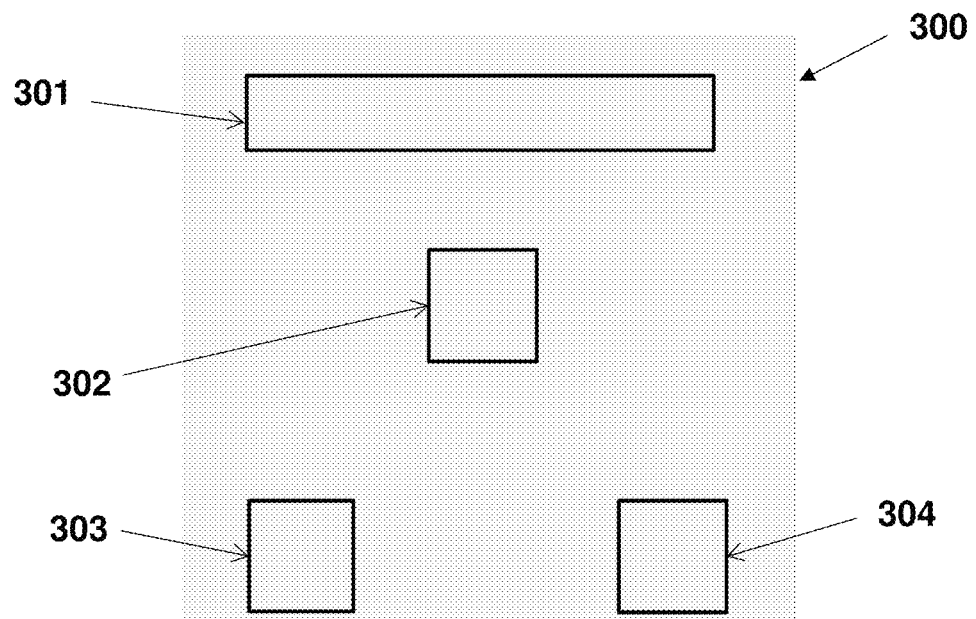
FIG. 3A illustrates an example pattern group, according to an embodiment.

FIG. 3A illustrates an example pattern group 300 comprising a first feature 301, a second feature 302, a third feature 303, and a fourth feature 304. In an embodiment, the features 301-304 have certain CD and are located a particular distance from each other according to a specification, e.g., of a circuit design.

Figure 3B:
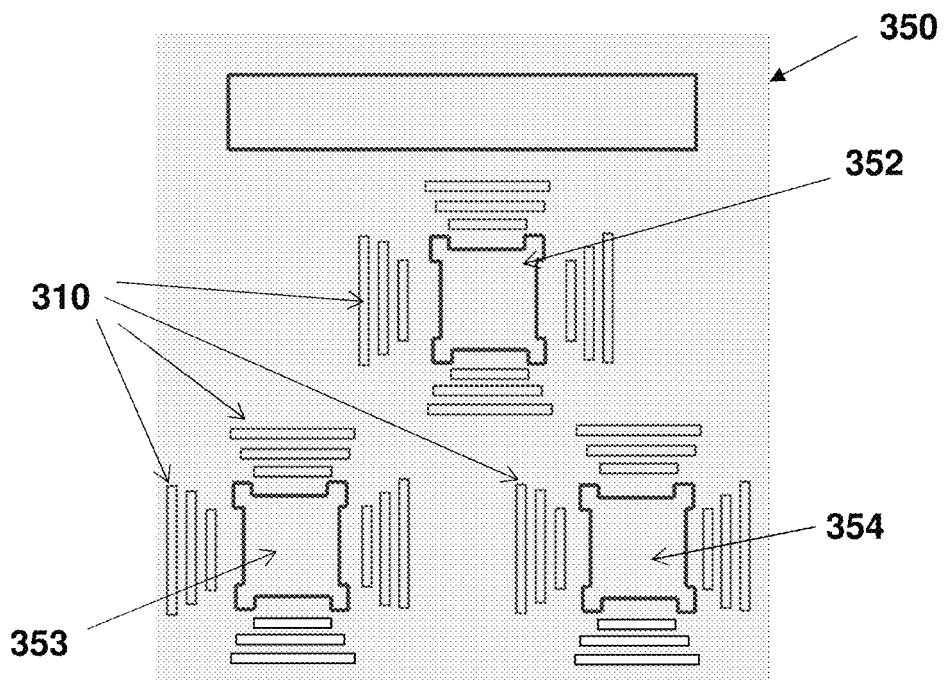
FIG. 3B is an example mask layout associated with the pattern group of FIG. 3A, according to an embodiment.

FIG. 3B is an example mask layout 350 associated with the pattern group 300 of the design layout. Typically, patterns or features of the design layout are modified, e.g., to include OPC, as discussed earlier, to generate a mask layout, which is further used in the patterning process to print a desired pattern. In the present example, the mask layout 350 includes optical proximity corrected features 352, 353, 354 corresponding to the features 302, 303, 304, respectively. In addition, the mask layout includes assist features such as SRAFs 310 placed around the features 352-354. In an embodiment, the SRAFs 310 are placed in the mask layout so that the printed pattern is as close as possible to the design layout (or desired pattern).

In an embodiment, SRAFs 310 are designed small enough so that they are not printed on the substrate. If the SRAFs 310 print on the substrate, the resulting feature(s) is/are considered a defect(s). Occasionally, SRAFs may be errantly printed due to several reasons such as dose, focus or other variations of the patterning process. It is desirable to identify such SRAFs and their locations so that appropriate modification (e.g., reduce size) may be made to the mask layout so that SRAFs are not printed. According to the present disclosure there is provided, among others, a method to identify such defective substrate and probable locations where SRAFs may be printed. In an embodiment, defective locations are identified with respect to a pattern group rather than isolated SRAFs or SRAF associated with an individual feature.

Figure 4:
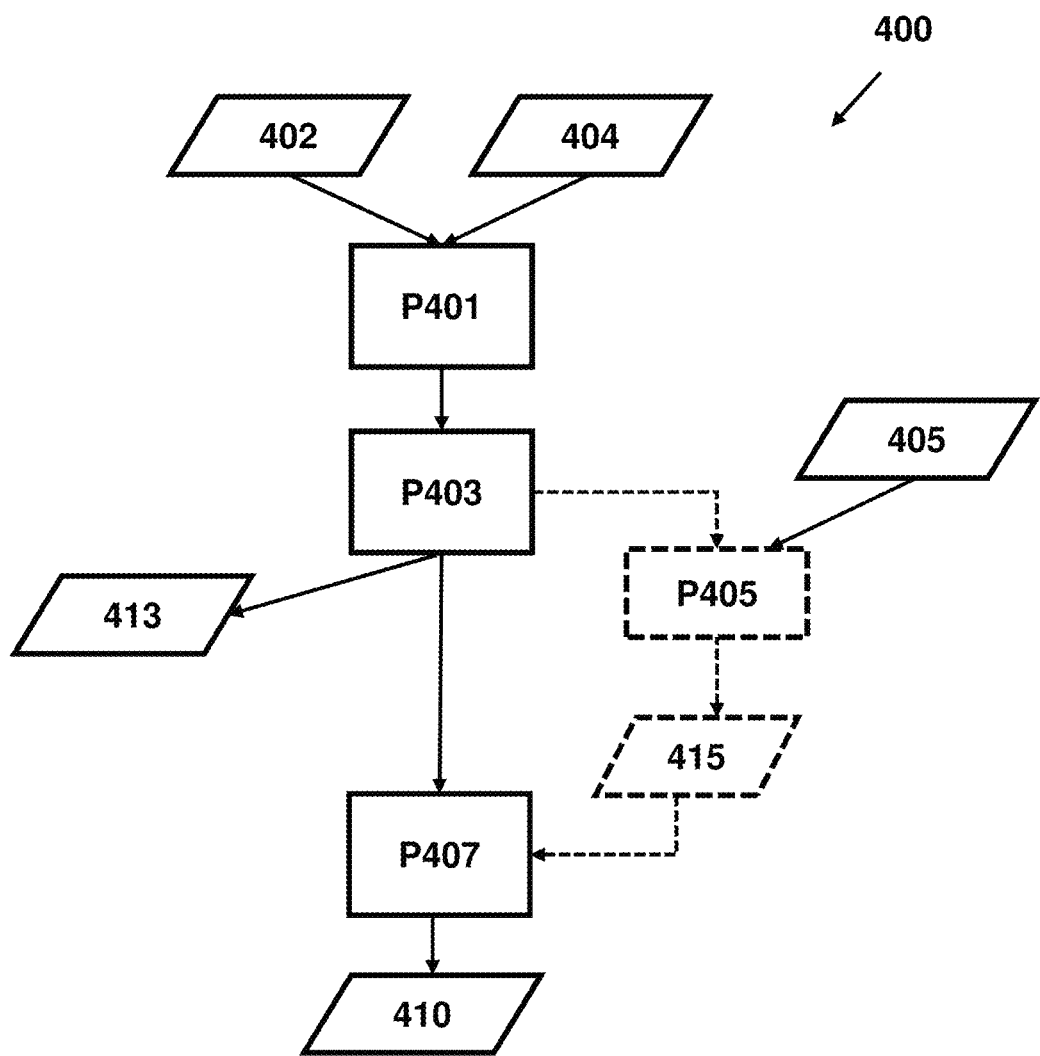
FIG. 4 is a flow chart of a method for determining a defect map of a pattern group of interest, a variation associated with the pattern group and corrections to features of a mask comprising the pattern group, according to an embodiment.

FIG. 4 is a flow chart of a method for determining a defect map of a pattern group of interest, a variation associated with the pattern group and corrections to features of a mask comprising the pattern group. The pattern group provides a reference for defining the defect map and metrology information (e.g., heat map showing CD variation). The metrology data provides data associated with printed primary patterns, where a primary pattern refers to patterns corresponding to the design pattern. In an embodiment, the printed pattern may include features e.g., SRAF or other features that should not be printed. The defect data is then associated with the pattern group, particularly to determine a probability of un-desired features (e.g., SRAFs) being printed on the substrate with reference to the pattern group.

Use of pattern groups to generate defect maps can provide several advantages and applications. In an embodiment, the pattern grouping facilitates defect analysis, for example, by grouping defects around neighborhood of a pattern group (e.g., in GDS format) into the same pool for statistical analysis. Also, such grouping can provide a localized defect analysis with regard to one or a few of the primary patterns that are located within an impact range of the SRAFs. In an embodiment, grouping frequently occurring patterns may reduce the pattern search space by one or more orders of magnitude. Corrections (e.g., OPC) may be determined for a particular instance of a pattern group and be applied to other instances of the pattern group across full-chip design layout, thereby reducing computational time and resources for a full-chip simulation. Also, such defect-based correction can effectively improve the yield of the patterning process.

In the method 400, process P401 involves obtaining (i) a pattern group 402 for a design layout, and (ii) defect inspection data 404 of a substrate imaged using the mask used in the patterning process for the design layout.

In an embodiment, the pattern group 402 is a group of features frequently printed (or desired to be printed) at one or more locations within a die or across different dies of a substrate. Such group may refer to a particular portion of a circuitry such as memory or other critical portion of the circuitry. In an embodiment, the group comprises a plurality of features located relatively close to each other and having particular characteristics. For example, a group may refer to 4-feature pattern of any shape, a 5-feature pattern of any shape, a pattern having contact holes, etc.

In an embodiment a pattern group for a design layout may be a user-defined set of patterns, may be a set of patterns that are associated with the most defects, may be a set of patterns that are associated with critical features, or may be other sets of patterns of interest. In an embodiment, patterns comprising the pattern group may be selected in any of various ways, such as by a user based on user-experience, based on a pattern search algorithm, etc.

In an embodiment, a pattern group comprises a set of patterns and a design layout may include a plurality of pattern groups. Then, a particular pattern group may be selected based on a pattern search algorithm that is configured to search for pattern groups whose member patterns meet a search criteria. For example, the search criteria comprises a particular feature type or feature characteristics. For example, a set of features (e.g., hole, bar, etc.) and feature characteristics (e.g., size, distance between features, etc.) may be input to the algorithm. Then, a pattern recognition algorithm may search for one or more pattern groups in a design layout that satisfy such search criteria (e.g., feature characteristics) associated with the member patterns of the pattern group. FIG. 3A is an example of a pattern group comprising a set of patterns.

The defect inspection data 404 may obtained via a defect detection algorithm. For example, the defect detection algorithm may be an algorithm configured to detect undesired features (e.g., SRAFs) based on a comparison of desired features and features in an image of the printed substrate (e.g., SEM image). In an embodiment, the defect inspection data 404 comprises a frequency of occurrence of a defect (e.g., an SRAF that is errantly printed), or size of the defect (e.g., CD of the SRAF).

Figure 5:
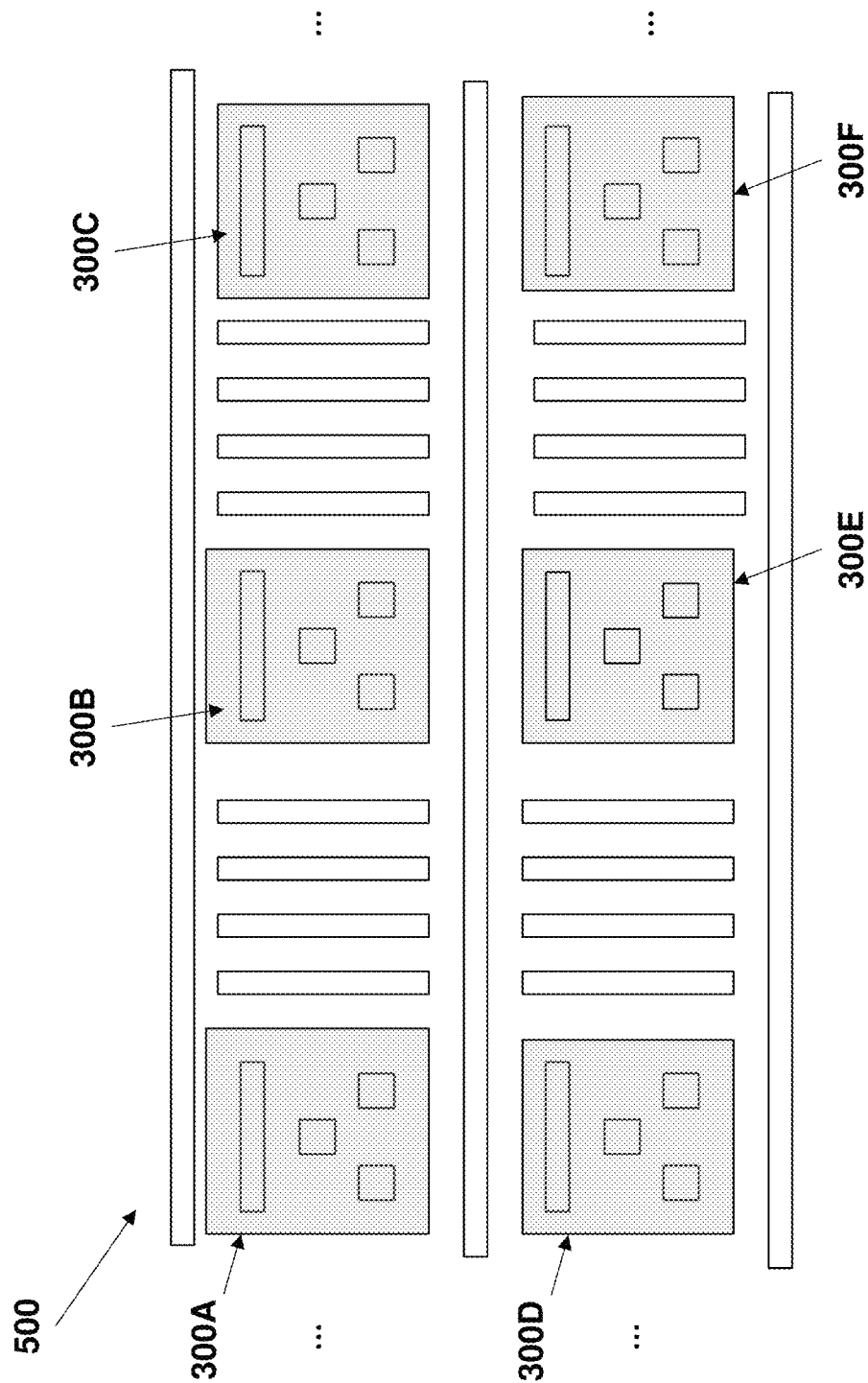
FIG. 5 illustrates example design layout and instances of a pattern group identified by a pattern search algorithm, according to an embodiment.

FIG. 5 illustrates example design layout and instances of the pattern group identified by a pattern search (or recognition) algorithm. The pattern search (or recognition) algorithm is configured to identify patterns within the design layout based on characteristics (e.g., CD, pitch, distance between features, etc.) associated with one or more features of a pattern of interest. For example, the pattern group 300 is a particular pattern of interest that has a rectangular feature, and three square features (or contact holes) placed in a triangular manner with respect to each other. Furthermore, the characteristic includes a size of a feature and a distance (not illustrated) between each feature. In an embodiment, the pattern search algorithm searches a design layout 500 for the pattern group 300 and identifies several instance of the pattern group such as 300A, 300B, 300C, 300D, 300E, and 300F. For each instance of the pattern group 300A-300F there will be a corresponding printed pattern on the substrate.

In an embodiment, the defect inspection data 404 of the printed substrate is obtained based on, e.g., substrate images acquired via a metrology tool. The defect inspection data 404 is further associated with the pattern group 300 or its instances thereof. In embodiment, a defect inspection data is obtained via the metrology tool (e.g., in FIG. 9 and FIG. 10) configured to image or measure a pattern on the printed substrate in a patterning process. In an embodiment, the metrology tool is a scanning electron microscope (SEM). In an embodiment, the defect inspection data 404 can be obtained from a SEM image comprising defects (e.g., SRAFs or other undesirable features). For example, a defect search algorithm may be configured to identify any defects within the SEM image by comparing the printed patterns in the SEM image with the design patterns. For example, the algorithm detects a defect when the SEM image includes a feature not defined in the design pattern. It can be understood by a person skilled in art that the present disclosure is not limited to SEM tool or a particular defect identification algorithm, any metrology tool configured to provide data of printed substrate and any algorithm configured to identify defects and their locations may be employed herein.

Figure 6:
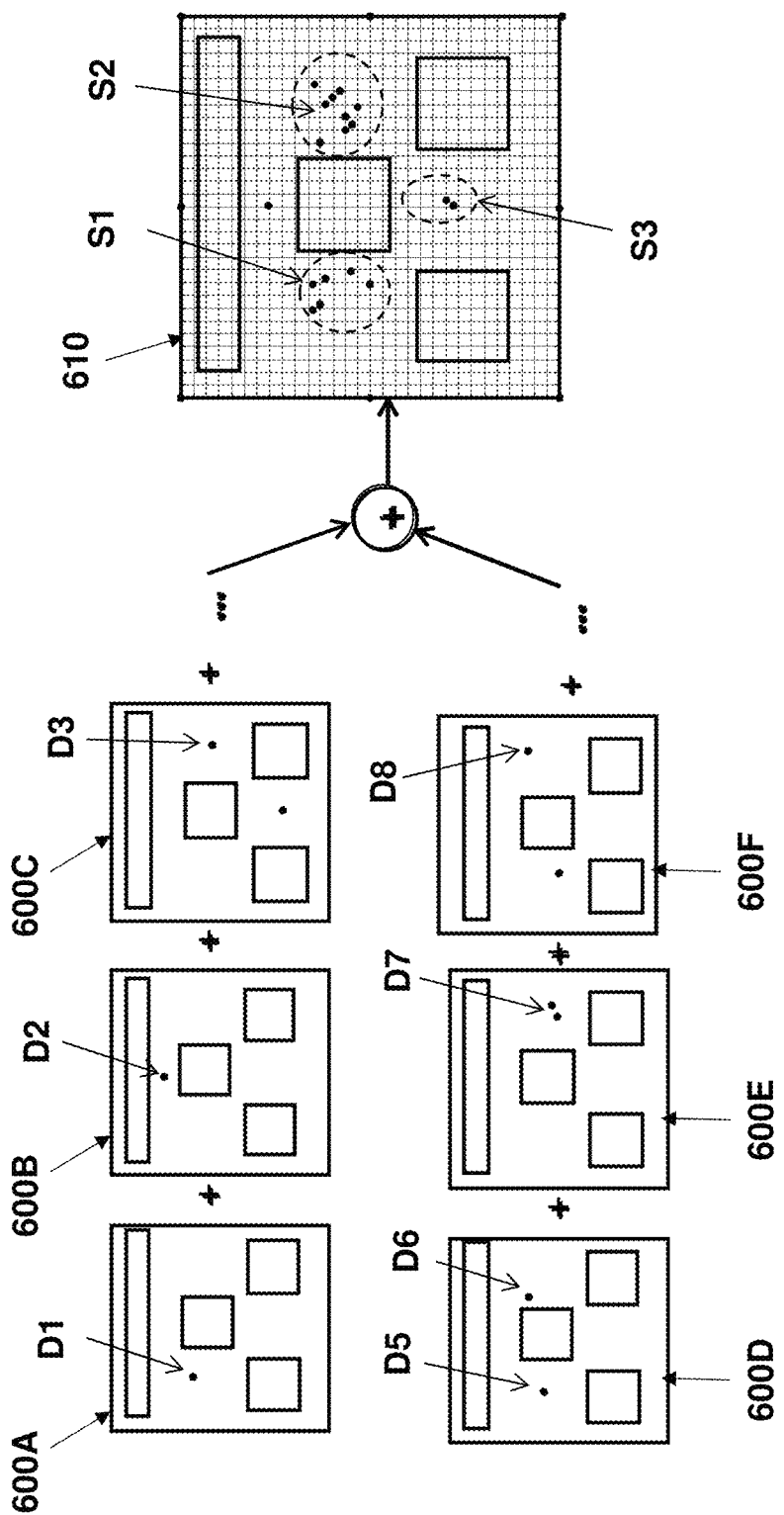
FIG. 6 illustrates an example of associating metrology data with a pattern group, according to an embodiment.

Further in the method 400, process P403 involves determining, based on the defect inspection data 404, a defect map 413 associated with the pattern group, wherein the defect map 413 comprises locations of assist features (e.g., SRAFs, or undesired features in general) having a relatively higher probability of being printed on the substrate compared to other patterns of the design layout. In an embodiment, the determining of the defect map 413 involves identifying a plurality of printed instances of the pattern group 402 within the defect inspection data 404; detecting assist features across the plurality of printed instances of the pattern group; and determining a probability of occurrence of assist features at a location of the pattern group 402; defining a grid (e.g., as shown in FIG. 6) for a printed instance of the plurality of printed instances of the pattern group 402; and determining, based on a location on the grid, a probability of occurrence of assist features at the location of the grid associated with the pattern group 402.

In an embodiment, the determining of the probability of occurrence of assist features at the location on the grid involves aligning the plurality of printed instances of the pattern group. In an embodiment, the aligning involves aligning features in each of the plurality of printed instances with corresponding features in pattern group 402 of the design layout. In an embodiment, a same grid may be defined for each of the plurality of the printed instances and each of the grids may be aligned.

Further, the determining of the probability involves, identifying a total number of assist features printed at the location on the grid of the printed pattern associated with the aligned plurality of printed instances, wherein the total number of the assist features printed at the location on the grid includes a total number of assist features detected, across the plurality of printed instances, at locations that correspond to the location on the grid; and determining the probability of occurrence of the assist features at the location based on the total number of the assist features at the location and a total number of detected assist features across the plurality of printed instances. In an embodiment, the location of the defects is a region associated with the pattern group 402.

In an embodiment, the probability computation may be based on a grid defined for a pattern group. For example, the process involves defining a grid for a printed instance of the plurality of printed instances of the pattern group; and determining, based on a location on the grid, a probability of occurrence of assist features at the location on the grid associated with the pattern group. In an embodiment, the plurality of printed instances of the pattern group are aligned. Then, a total number of assist features printed at the location on the grid of the aligned printed instances are identified. Further, the probability of occurrence of the assist features at the location on the grid is determined. For example, the probability is determined based on the total number of the assist features printed at a particular location on the grid or a total number of detected assist features across the plurality of printed instances. In an embodiment, the probability of occurrence is determined based on a size of one or more assist feature at a particular location on the grid, where a selected assist feature is at the particular location on the grid when the selected assist feature is at a location, across the plurality of printed instances, that corresponds to the particular location on the grid. In an embodiment, the grid may be at least one of: a square grid, a rectangular grid, a triangular grid, a radial grid or any other grid format that can be used to correlate location information with the assist features associated with the grid.

In an embodiment, an assist feature associated with the pattern group has an increased probability of being printed when the probability is above a predetermined threshold. In an embodiment, the predetermined threshold associated with a characteristic (e.g., CD) of the assist feature. For example, the assist feature greater than 4 nm within a pattern group comprising features of sizes greater than 20 nm has an increased probability of being printed on the substrate.

In an embodiment, the predetermined threshold may be determined based on a reference group of patterns. Accordingly, an assist feature associated with the pattern group has an increased probability of being printed when the probability is above a median or average probability of the reference group of assist features.

In an embodiment, an assist feature is not limited to a particular layer of a substrate. In an embodiment, an assist feature being printed on the substrate includes the assist features being printed on any of a plurality of layers manufactured on the substrate.

Figure 7:
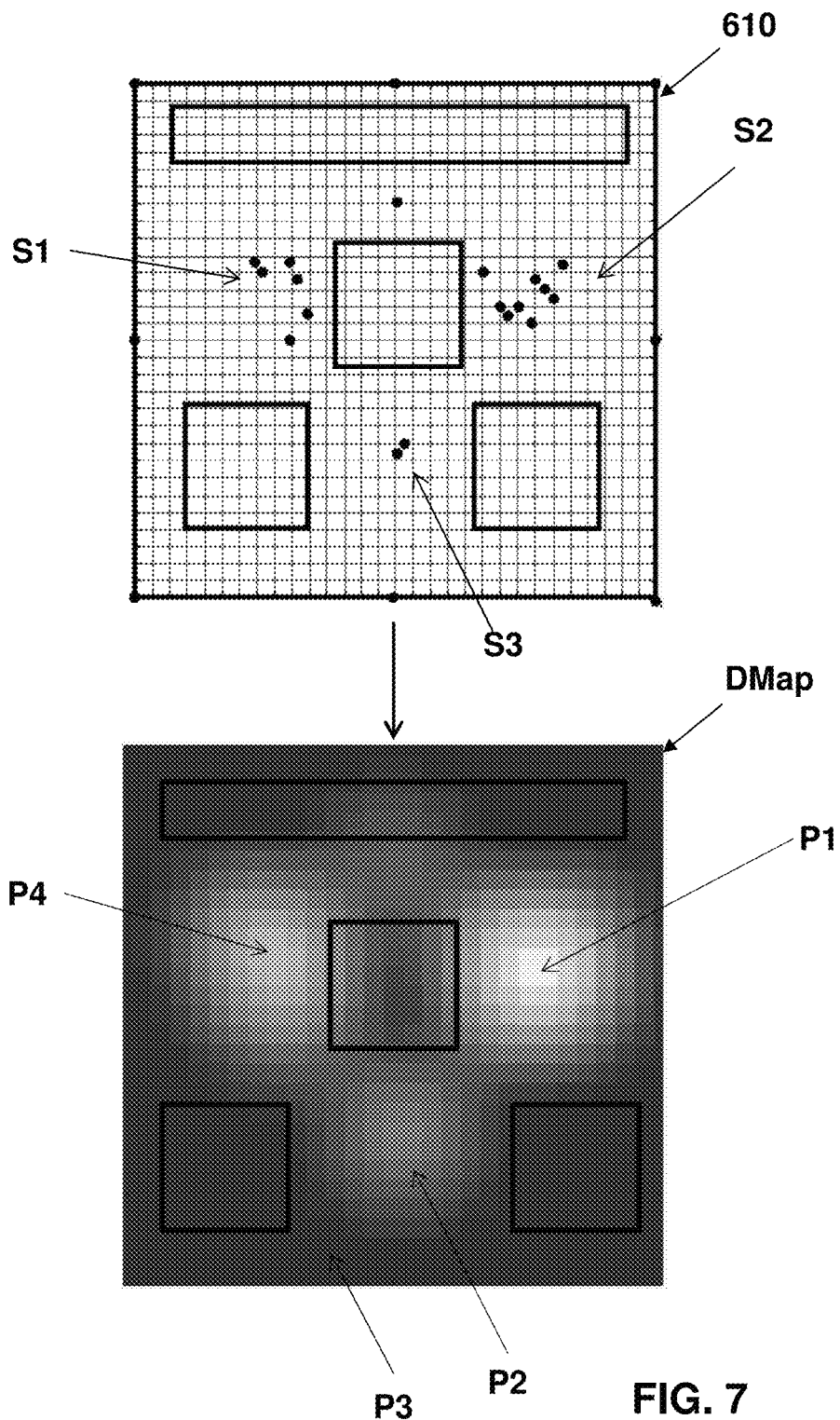
FIG. 7 illustrate an example of determining of a defect map, according to an embodiment.

FIGS. 6 and 7 illustrate an example of determining of a defect map (e.g., 413 of the method 400) based on the defect inspection data (e.g., 404 of the method 400) associated with the pattern group 300. For example, the defect inspection data contains defect information such as defect type (e.g., necking, bridging, etc.), defect location with respect to the pattern group or substrate, defect size (e.g., CD values of a defective feature), etc. FIG. 6 illustrates associating the defect inspection data (e.g., CD, EPE, roughness, etc.) with a pattern group 300. For example, instances of printed substrate 600A-600F corresponding to the pattern group 300 (in FIG. 3A) are identified from the substrate images (e.g., SEM image). As mentioned in the method 400, defects (e.g., SRAFs) may be identified based on a defect detection algorithm configured to identify undesired features in portions of substrate images (e.g., SEM images) corresponding to the pattern group 300 (in FIG. 3A). In an embodiment, the undesired features are SRAFs 310 (in FIG. 3B) of the mask layout 350 (in FIG. 3B) and the identification of defects involves searching for printed SRAFs within the metrology data at locations associated with the SRAFs 310 (in FIG. 3B).

As shown in FIG. 6, different portions of printed substrate includes printed SRAFs (an example of defect) at different locations. For example, a printed portion 600A includes a defect D1, a printed portion 600A includes a defect D1, a printed portion 600B includes a defect D2, a printed portion 600C includes a defect D3, a printed portion 600D includes a defect D5 and D6, a printed portion 600E includes a defect D7, and a printed portion 600F includes a defect D8. Each instances 600A-600F of printed substrate associated with the pattern group 300 (in FIG. 3A) are aligned with respect to each other. Further, a grid 610 may be overlaid on the aligned instances 600A-600F and defects of each instance 600A-600F may be plotted on the grid 610. Thus, the grid 610 may include the pattern group 300 and defects (e.g., D1-D8). In the grid 610, the defects or locations thereof are generally marked as S1, S2, and S3.

Further, referring to FIG. 7, probability values may be computed with respect to number of defects at particular location (e.g., S1, S2, S3, etc.) and the total number of defects D1-D8. Accordingly, some locations may have relatively higher probability of defects and some locations may have zero probability of defect occurrence. In an embodiment, such probability of defects is represented as a defect map DMap, as shown. In an embodiment, the defect map may be in vector form. Each location within the defect map DMap has a probability value of a defect. In other words, the defect map DMap shows probable locations of defects with respect to the pattern group (e.g., 300). Within the defect map, the probability P1 (e.g., associated with S2) is the highest probability of defect, and the probability P3 is a zero. In the example map DMap, probability P1>P4>P2>P3. Such defect map may be used in OPC (e.g., method of FIGS. 11-14) to determine corrections to, for example, size of the SRAFs.

Referring back to FIG. 4, in the method 400, process P405 may further involve obtaining metrology data 405, via a metrology tool, and determining, based on the metrology data 405, a variation 415 (also referred as a band or variation band) of a metric (e.g., CD, EPE) associated with the pattern group. The variation 415 characterizes the amount of variation in the printed pattern group 402. In an embodiment, a mean or other appropriate statistic associated with the metric may be determined based on the metrology data 405. For example, the statistic is at least one of: a distribution of critical dimension (CD) values associated with the pattern group, a standard deviation of CD values associated with the pattern group, an edge variation band width associated with the pattern group, or a three-sigma variation of line roughness associated with the pattern group. In an embodiment, the optimization process uses such statistic with the design variable to determine optimum values of the design variables (e.g., $(z_1, z_2, \ldots, z_N)$) of the optimization process, as discussed herein.

In an embodiment, the determining of the variation 415 of the metric involves identifying a plurality of printed instances of the pattern group 402 within the metrology data 405; aligning the plurality of printed instances of the pattern group 402; and determining the variation 415 of the metric associated with the pattern group 402. In an embodiment, the metric is a critical dimension, line edge roughness, or a geometric property associated with a feature of the pattern group 402. As mentioned earlier, relevant metrology data 405 is obtained via a metrology tool. The metrology tool is a scanning electron microscope (SEM) and the metrology data 405 is a SEM image. In an embodiment, data relevant to the particular metric can be extracted from the metrology data 405 (e.g., contours of the pattern group).

Figure 8A:
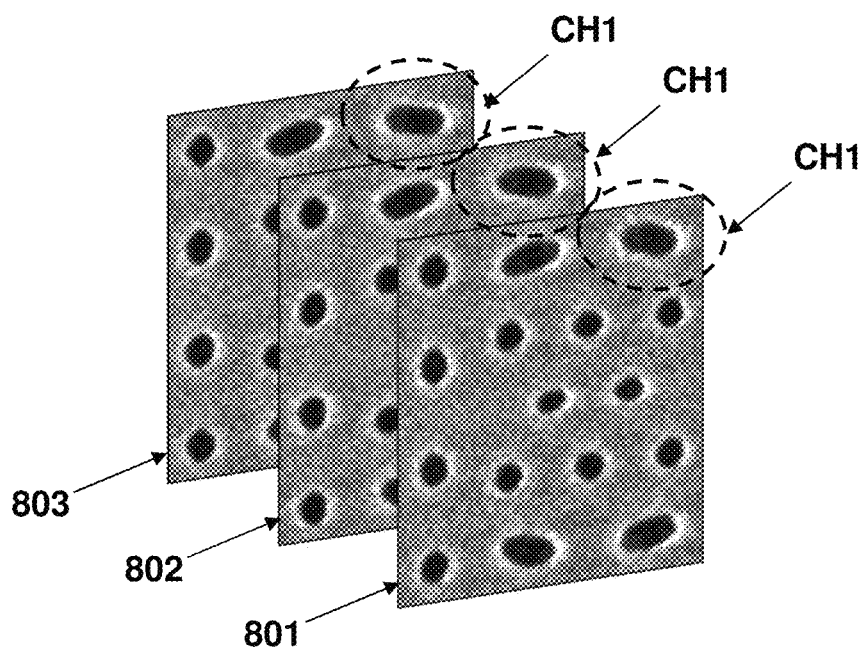
FIGS. 8A and 8B illustrate example metrology data (e.g., CD, EPE, SEM images) and variation of a metric (e.g., CD), according to an embodiment.
Figure 8B:
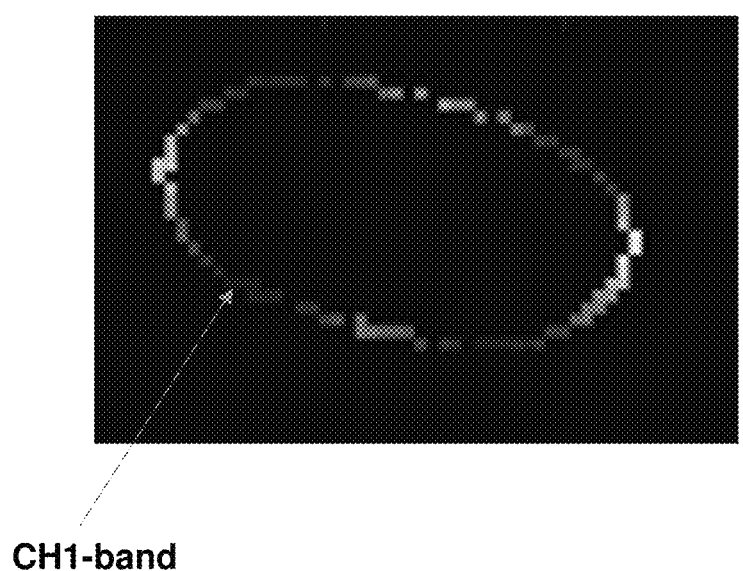

FIGS. 8A and 8B illustrate example metrology data (e.g., SEM images) and variation of a metric (e.g., CD). In FIG. 8A, SEM images 801, 802, and 803 corresponding to a desired pattern group (e.g., comprising a feature such as a contact holes CH1) are aligned. The SEM images 801-803 may be associated with different dies or different locations of a particular die. When images 801-803 are aligned, a variation band CH1-band of the features (e.g., CH1) is obtained. In an embodiment, such variation band CH1-band is characterized by pixel intensities along the contact hole CH1. For example, in an embodiment, signals having relatively high pixel intensity values are aligned and a band is determined based on pixel intensity values relatively close to the aligned feature (e.g., CH1). In an embodiment, the variation band is a variation in CD values of the contact hole CH1. Such variation band CH1-band can be further used to improve one or more aspects (e.g., OPC, defect detection, etc.) of the patterning process.

Referring back to FIG. 4, the method 400 may include process P407 that involves determining, via simulating an optical proximity correction process using data associated with the defect map 413 or the variation 415 of the metric, corrections to the features of the mask. For example, data associated with the defect map includes a location of the defect on the defect map, a probability value of the defect at the location, a size of the assist feature at the location, etc. Example optical proximity correction processes are further discussed with respect to FIGS. 11-14. In an embodiment, the OPC processes may be configured to determine corrections based on a CD band 415 or EPE band 415 associated with one or more features to which OPC being determined. Furthermore, the defect map 413 may guide the OPC process to locations having relatively high probability of SRAF occurrence and modify the size of SRAFs at such locations. In an embodiment, no defect or very low defect counts are found in SRAF areas, but the metrology data suggest that the pattern group has a CD or pitch variation larger than tolerance, and the OPC model can try to adjust the SRAF parameters accordingly.

Figure 9:
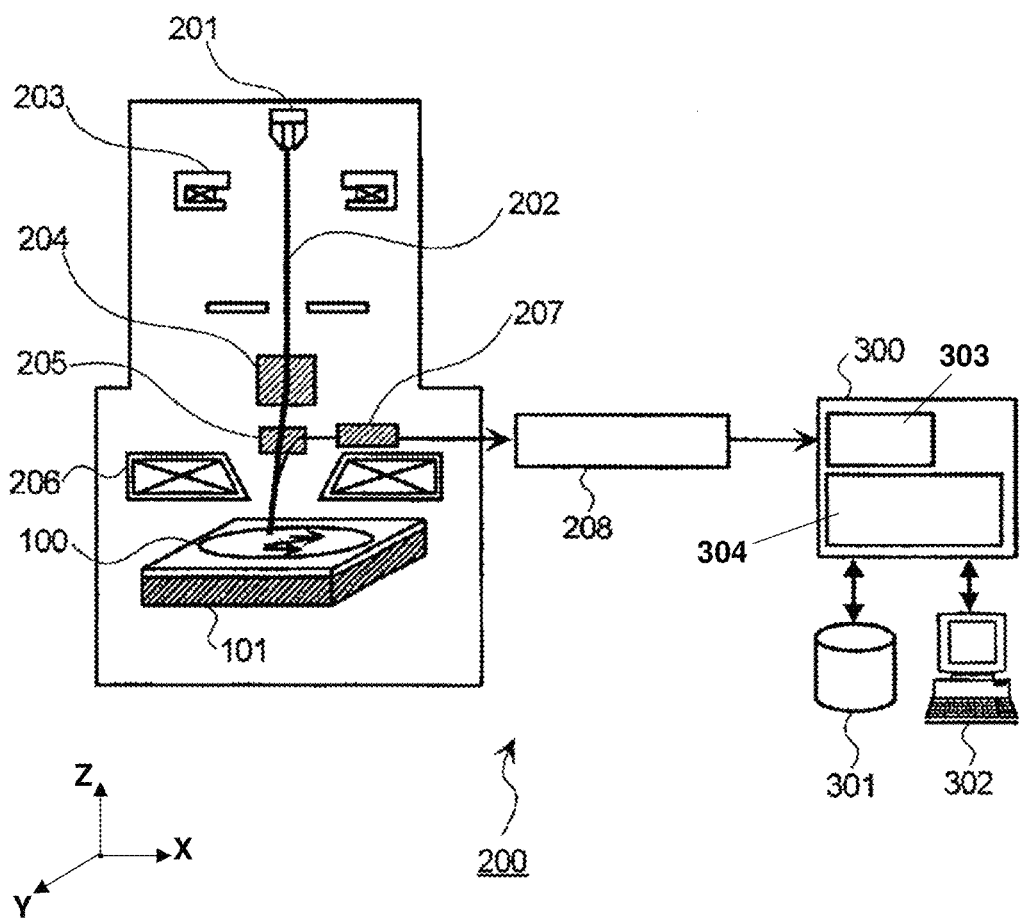
FIG. 9 schematically depicts an embodiment of a scanning electron microscope (SEM), according to an embodiment.

In some embodiments, a scanning electron microscope (SEM) yields an image of a structure (e.g., some or all the structure of a device) exposed or transferred on the substrate. FIG. 9 depicts an embodiment of a SEM 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two-dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction.

A signal detected by secondary electron detector 207 is converted to a digital signal by an analog/digital (N/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software) is configured to convert or process the digital images into datasets representative of the digital images. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Figure 10:
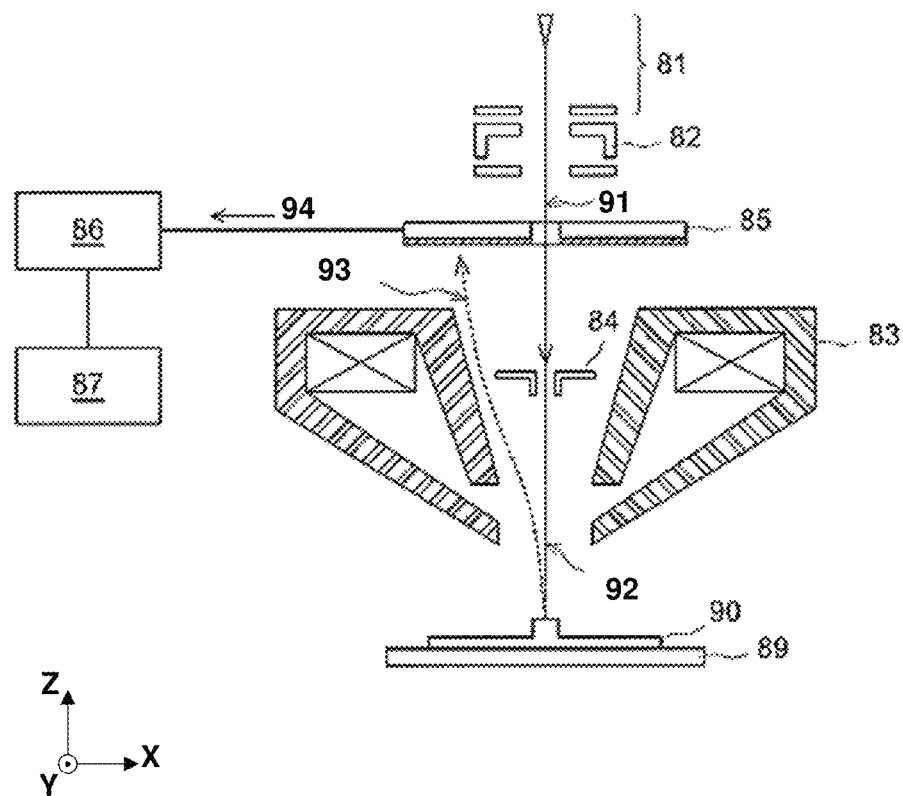
FIG. 10 schematically depicts an embodiment of an electron beam inspection apparatus, according to an embodiment.

FIG. 10 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (may be also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other pattering processes, the structure may be a device or a portion thereof that is being manufactured and the images may be SEM images of the structure. In some instances, the structure may be a feature of semiconductor device, e.g., integrated circuit. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

In an embodiment, the measurement data (e.g., stochastic variations) related to the printed pattern, determined according to the method of FIG. 3, may be employed in optimization of patterning process or adjusting parameters of the patterning process. As an example, OPC addresses the fact that the final size and placement of an image of the design layout projected on the substrate will not be identical to, or simply depend on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. Patent App. Publication No. 2005-0076322 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as $\gamma$ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in PCT Patent Application Publication No. WO 2010/059954, which is hereby incorporated by reference in its entirety.

Another source and mask optimization method and system that involves optimizing the source by adjusting pixels of the source is described in U.S. Patent Application Publication No. 2010/0315614, which is hereby incorporated by reference in its entirety.

In a lithographic projection apparatus, as an example, a cost function is expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic effects such as the LWR, which are functions of the design variables $(z_1, z_2, \ldots, z_N)$. The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots, z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots, z_N)$ is not limited the form in Eq. 1. $CF(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq. 1). For example, if considering N PW conditions, then one can categorize the evaluation points according to their PW conditions and write the cost functions as:

$$CF(z_1, z_2, \ldots, z_N) = \qquad \text{(Eq. 1')}$$
$$\sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z)$$

Where $f_p(z_1, z_2, \ldots, z_N)$ is the value of $f_p(z_1, z_2, \ldots, z_N)$ under the u-th PW condition $u=1, \ldots, U$. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. The desired throughput may limit the dose and thus has implications for the stochastic effects (e.g., imposing a lower bound on the stochastic effects). Higher throughput generally leads to lower dose, shorter longer exposure time and greater stochastic effects. Consideration of substrate throughput and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots, \tilde{z}_N) = \operatorname*{argmin}_{(z_1, z_2, \ldots, z_N) \in Z} CF(z_1, z_2, \ldots, z_N) = \qquad \text{(Eq. 2)}$$
$$\operatorname*{argmin}_{(z_1, z_2, \ldots, z_N) \in Z} \sum_{p=1}^{P} w_p f_p^2(z_1, z_2, \ldots, z_N)$$

Figure 11:
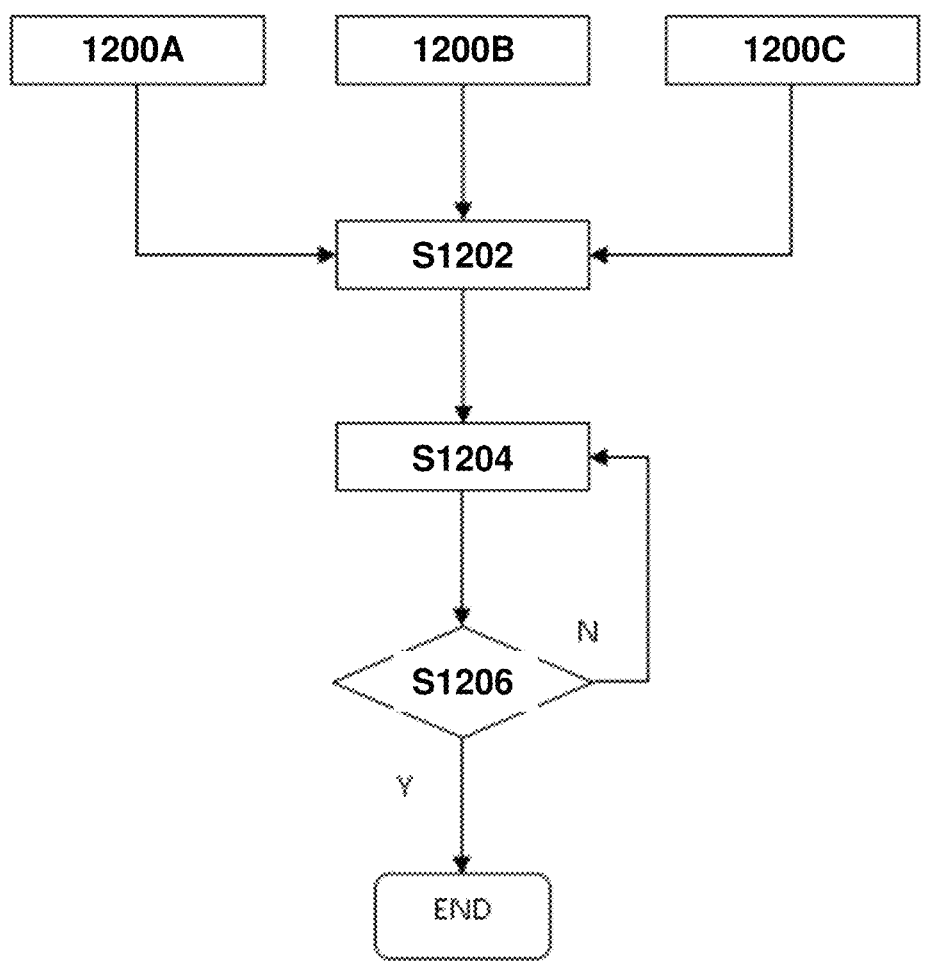
FIG. 11 is a flow diagram illustrating aspects of an example methodology of joint optimization, according to an embodiment.

A general method of optimizing the lithography projection apparatus, according to an embodiment, is illustrated in FIG. 11. This method comprises a step S1202 of defining a multi-variable cost function of a plurality of design variables. The design variables may comprise any suitable combination selected from characteristics of the illumination source (1200A) (e.g., pupil fill ratio, namely percentage of radiation of the source that passes through a pupil or aperture), characteristics of the projection optics (1200B) and characteristics of the design layout (1200C). For example, the design variables may include characteristics of the illumination source (1200A) and characteristics of the design layout (1200C) (e.g., global bias) but not characteristics of the projection optics (1200B), which leads to an SMO. Alternatively, the design variables may include characteristics of the illumination source (1200A), characteristics of the projection optics (1200B) and characteristics of the design layout (1200C), which leads to a source-mask-lens optimization (SMLO). In step S1204, the design variables are simultaneously adjusted so that the cost function is moved towards convergence. In step S1206, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S1206 is satisfied, the method ends. If none of the conditions in step S1206 is satisfied, the step S1204 and S1206 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics or any other design variables, are allowed to change at the same time. The term "alternative" and "alternatively" as used herein mean that not all of the design variables are allowed to change at the same time.

Figure 12:
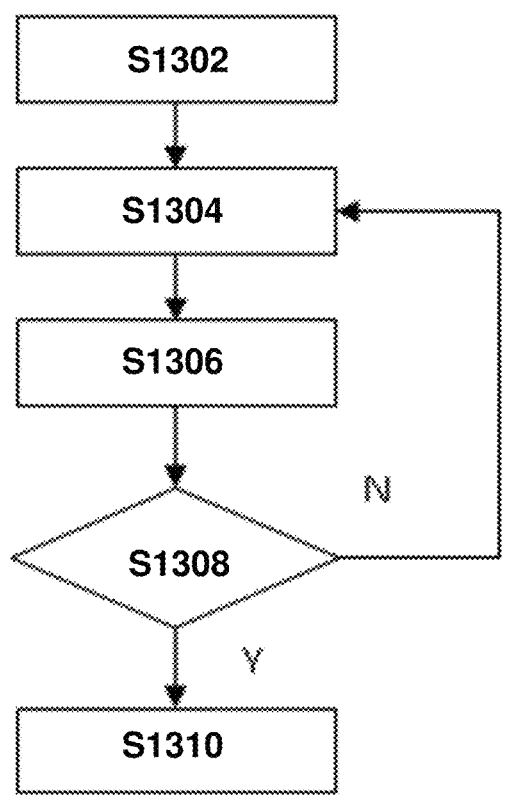
FIG. 12 shows an embodiment of another optimization method, according to an embodiment.

In FIG. 12, the optimization of all the design variables is executed simultaneously. Such flow may be called the simultaneous flow or co-optimization flow. Alternatively, the optimization of all the design variables is executed alternatively, as illustrated in FIG. 12. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 12, first, a design layout (step S1302) is obtained, then a step of source optimization is executed in step S1304, where all the design variables of the illumination source are optimized (SO) to minimize the cost function while all the other design variables are fixed. Then in the next step S1306, a mask optimization (MO) is performed, where all the design variables of the patterning device are optimized to minimize the cost function while all the other design variables are fixed. These two steps are executed alternatively, until certain terminating conditions are met in step S1308. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally, the output of the optimization result is obtained in step S1310, and the process stops.

The pattern selection algorithm, as discussed before, may be integrated with the simultaneous or alternative optimization. For example, when an alternative optimization is adopted, first a full-chip SO can be performed, the 'hot spots' or 'warm spots' are identified, then an MO is performed. In view of the present disclosure numerous permutations and combinations of sub-optimizations are possible in order to achieve the desired optimization results.

Figure 13A:
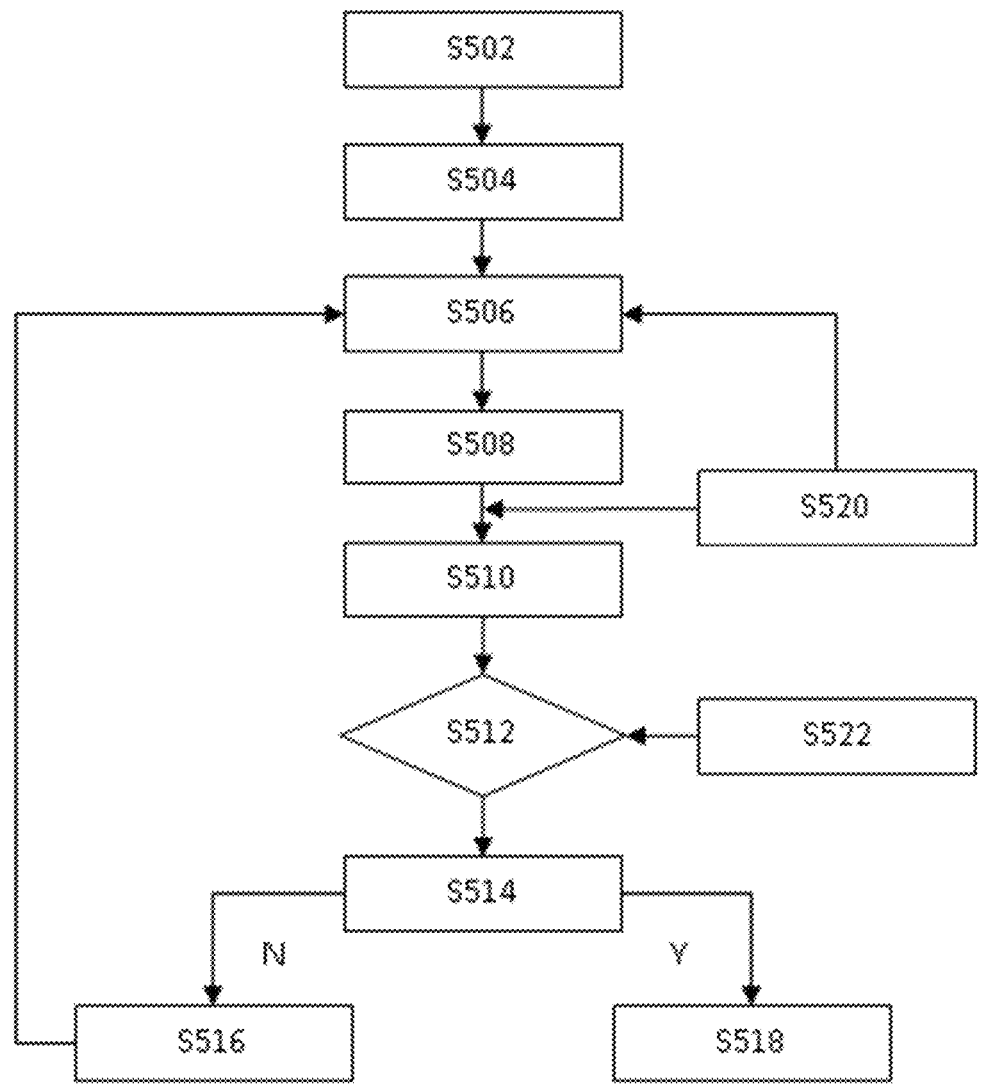
FIGS. 13A, 13B and 14 show example flowcharts of various optimization processes, according to an embodiment.

FIG. 13A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 13A is elaborated in detail below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

(n=1,2, ... N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_1, z_2, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_1, z_2, \ldots, z_N)$, $$\partial f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \qquad (\text{Eq. 3})$$

Under the approximation of Eq. 3, the cost function becomes:

$$CF(z_1, z_2, \ldots, z_N) = \qquad (\text{Eq. 4})$$
$$\sum_{p=1}^{P} w_p f_p^2(z_1, z_2, \ldots, z_N) = \sum_{p=1}^{P} w_p \Bigg( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \Bigg)^2$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, z_{N(i+1)})$ can be derived by solving by N linear equations:

$$\frac{\partial CF(z_1, z_2, \ldots, z_N)}{\partial z_n} = 0,$$

wherein n=1,2, ... N.

If the design variables $(z_1, z_2, \ldots, z_N)$ are under the constraints in the form of J inequalities (e.g. tuning ranges of $(z_1, z_2, \ldots, z_N)$)

$$\sum_{n=1}^{N} A_{nj} z_n \le B_j,$$

for j=1,2, ... J; and K equalities (e.g. interdependence between the design variables)

$$\sum_{n=1}^{N} C_{nk} z_n = D_k,$$

for k=1,2, ... K; the optimization process becomes a classic quadratic programming problem, wherein $A_{nj}$, $B_j$, $C_{nk}$, $D_k$, are constants. Additional constraints can be imposed for each iteration. For example, a "damping factor" $\Delta_D$ can be introduced to limit the difference between $(z_{1(i+1)}, z_{2(i+1)}, z_{N(i+1)})$ and $(z_{1i}, z_{2i}, \ldots, z_{Ni})$, so that the approximation of Eq. 3 holds. Such constraints can be expressed as $z_{ni} - \Delta_D \le z_{ni} \le z_{ni} + \Delta_D \cdot (z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin N.Y.: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \le p \le P} \frac{f_p(z_1, z_2, \ldots, z_N)}{CL_p}, \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q, \quad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \le f_p(z_1, z_2, \ldots, z_N) \le E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for p=1, ... P, $$\sum_{n=1}^{N} \frac{\partial f_p(z_1, z_2, \ldots, z_N)}{\partial z_n} \bigg|_{z_1=z_{1i}, z_2=z_{2i}, \ldots, z_N=z_{Ni}}, \quad \text{(Eq. 6')}$$

$$z_n \le E_{Up} + \sum_{n=1}^{N} \frac{\partial f_p(z_1, z_2, \ldots, z_N)}{\partial z_n} \bigg|_{z_1=z_{1i}, z_2=z_{2i}, \ldots, z_N=z_{Ni}},$$

$$z_{ni} - f_p(z_{1i}, z_{2i}, \ldots, z_{Ni})$$

and $$-\sum_{n=1}^{N} \frac{\partial f_p(z_1, z_2, \ldots, z_N)}{\partial z_n} \bigg|_{z_1=z_{1i}, z_2=z_{2i}, \ldots, z_N=z_{Ni}}, \quad \text{(Eq. 6'')}$$

$$z_n \le -E_{Up} - \sum_{n=1}^{N} \frac{\partial f_p(z_1, z_2, \ldots, z_N)}{\partial z_n} \bigg|_{z_1=z_{1i}, z_2=z_{2i}, \ldots, z_N=z_{Ni}},$$

$$z_{ni} + f_p(z_{1i}, z_{2i}, \ldots, z_{Ni})$$

Since Eq. 3 is generally valid only in the vicinity of $(z_{1i}, z_{2i}, \ldots, z_{Ni})$, in case the desired constraints $E_{Lp} \le f_p(z_1, z_2, \ldots, z_N) \le E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_{1i}, z_{2i}, \ldots, z_{Ni})$. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = (1-\lambda) \sum_{p=1}^{P} w_p f_p^2(z_1, z_2, \ldots, z_N) + \lambda \max_{1 \le p \le P} \frac{\partial f_p(z_1, z_2, \ldots, z_N)}{CL_p} \quad \text{(Eq. 6''')}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image is within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \Delta\varepsilon)$:

$$CF(z_1, z_2, \ldots, z_N) = \max_{(f,\varepsilon)=(f_0\pm\Delta f, \varepsilon_0\pm\Delta\varepsilon)} \max_p |f_p(z_1, z_2, \ldots, z_N, f, \varepsilon)|. \quad \text{(Eq. 7)}$$

or $$CF(z_1, z_2, \ldots, z_N, f_0, \varepsilon_0) = \sum_{(f,\varepsilon)=(f_0\pm\Delta f, \varepsilon_0\pm\Delta\varepsilon)} \sum_p w_p f_p^2(z_1, z_2, \ldots, z_N, f, \varepsilon) \quad \text{(Eq. 7')}$$

or $$CF(z_1, z_2, \ldots, z_N, f_0, \varepsilon_0) = \quad \text{(Eq. 7'')}$$
$$(1-\lambda) \sum_{(f,\varepsilon)=(f_0\pm\Delta f, \varepsilon_0\pm\Delta\varepsilon)} \sum_p w_p f_p^2(z_1, z_2, \ldots, z_N, f, \varepsilon) +$$
$$\lambda \max_{(f,\varepsilon)=(f_0\pm\Delta f, \varepsilon_0\pm\Delta\varepsilon)} \max_p |f_p(z_1, z_2, \ldots, z_N, f, \varepsilon)|$$

If the nominal focus found nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \Delta\varepsilon)$ is accepted as part of the process window, if a set of values of $(z_1, z_2, \ldots, z_N, f, \varepsilon)$ can be found such that the cost function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \Delta\varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7''. If the design variables are characteristics of the projection optics, such as the Zernike coefficients, then minimizing the cost functions of Eqs. 7, 7', or 7'' leads to process window maximization based on projection optics optimization, i.e., LO. If the design variables are characteristics of the source and patterning device in addition to those of the projection optics, then minimizing the cost function of Eqs. 7, 7', or 7'' leads to process window maximizing based on SMLO, as illustrated in FIG. 12. If the design variables are characteristics of the source and patterning device and, then minimizing the cost functions of Eqs. 7, 7', or 7'' leads to process window maximization based on SMO. The cost functions of Eqs. 7, 7', or 7'' can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 14:
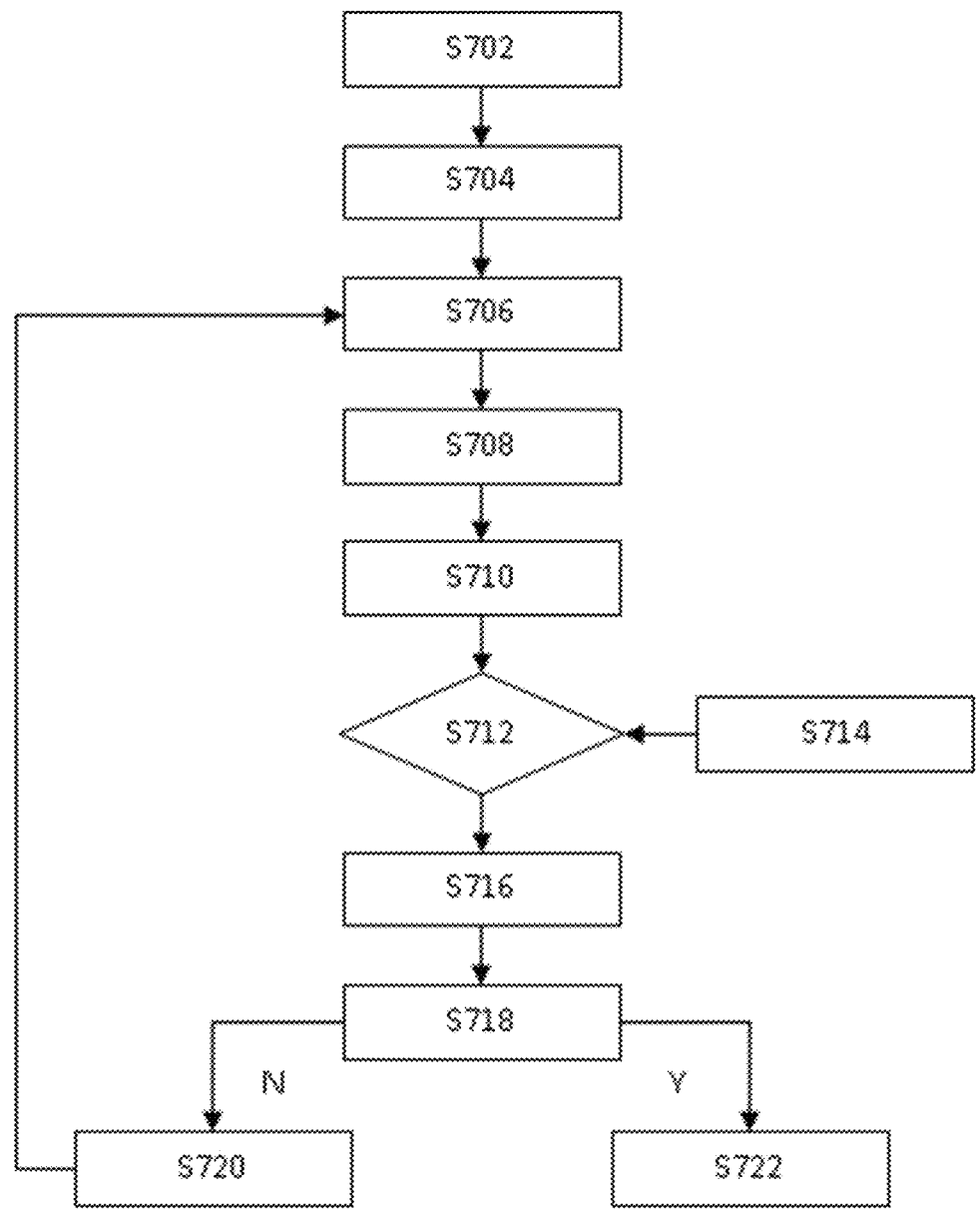

FIG. 14 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and is compared with predicted values of those quantities in step S712. In step S716, a process window is determined. Steps S718, S720, and S722 are similar to corresponding steps S514, S516 and S518, as described with respect to FIG. 13A. As mentioned before, the final output may be a wavefront aberration map in the pupil plane, optimized to produce the desired imaging performance. The final output may also be an optimized source map or an optimized design layout.

Figure 13B:
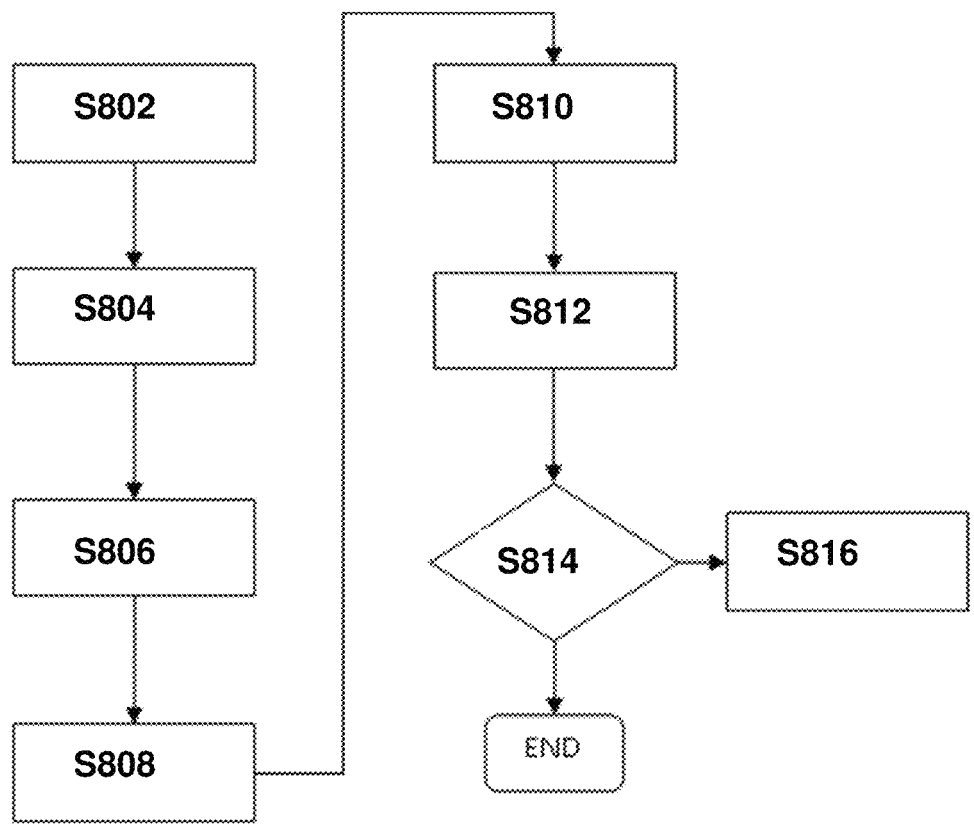

FIG. 13B shows an exemplary method to optimize the cost function where the design variables $(z_1, z_2, \ldots, z_N)$ include design variables that may only assume discrete values.

The method starts by defining the pixel groups of the illumination source and the patterning device tiles of the patterning device (step S802). Generally, a pixel group or a patterning device tile may also be referred to as a division of a lithographic process component. In one exemplary approach, the illumination source is divided into 117 pixel groups, and 94 patterning device tiles are defined for the patterning device, substantially as described above, resulting in a total of 211 divisions.

In step S804, a lithographic model is selected as the basis for photolithographic simulation. Photolithographic simulations produce results that are used in calculations of photolithographic metrics, or responses. A particular photolithographic metric is defined to be the performance metric that is to be optimized (step S806). In step S808, the initial (pre-optimization) conditions for the illumination source and the patterning device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps S802, S804, S806, and S808 are depicted as sequential steps, it will be appreciated that in other embodiments of the invention, these steps may be performed in other sequences.

In step S810, the pixel groups and patterning device tiles are ranked. Pixel groups and patterning device tiles may be interleaved in the ranking. Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups or patterning device tiles are also performed within the optimization process of S812.

In an alternative embodiment the interleaved simultaneous optimization procedure may include to alter a pixel group of the illumination source and if an improvement of the performance metric is found, the dose is stepped up and down to look for further improvement. In a further alternative embodiment, the stepping up and down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, measurement data (e.g., SEPE) determined as in method of FIG. 3, LWR or local CD variation of 2D features. In one embodiment, the stochastic effects include stochastic variations of characteristics of a resist image. For example, such stochastic variations may include failure rate of a feature, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

Figure 15:
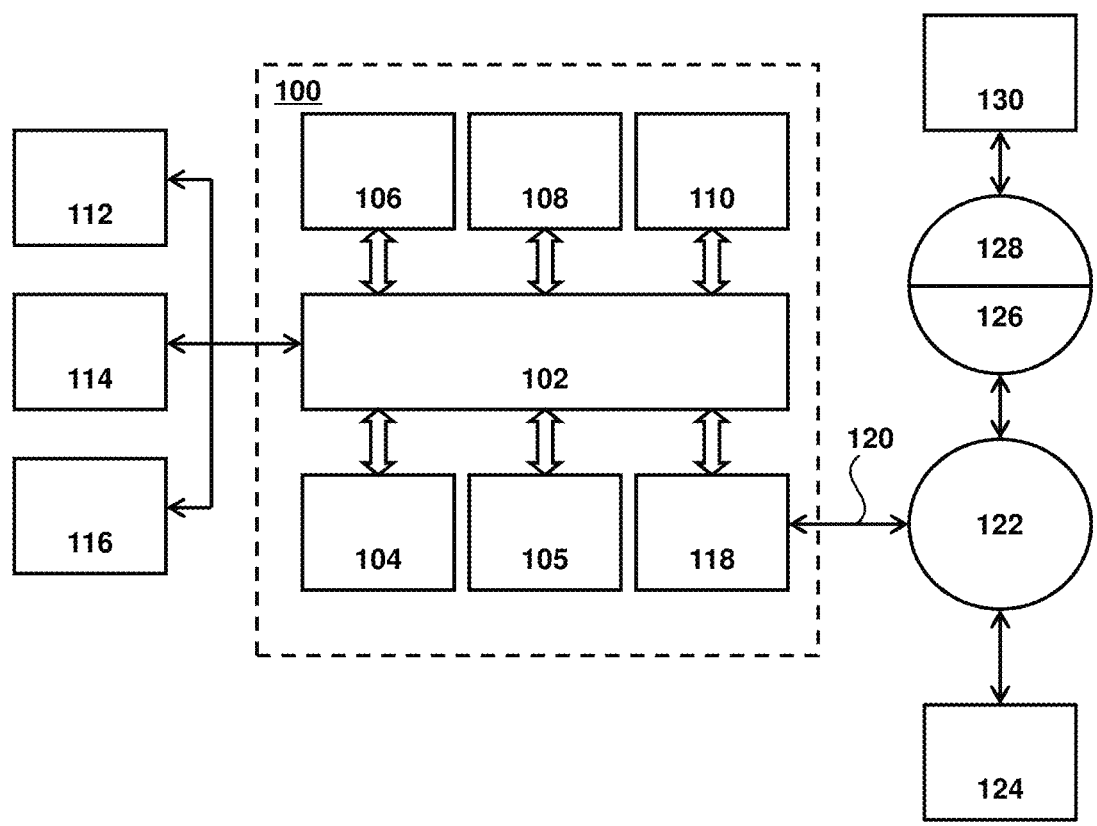
FIG. 15 is a block diagram of an example computer system, according to an embodiment.

FIG. 15 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, or stored in storage device 110, or other non-volatile storage for later execution. In this manner, computer system 100 may obtain application code in the form of a carrier wave.

Figure 16:
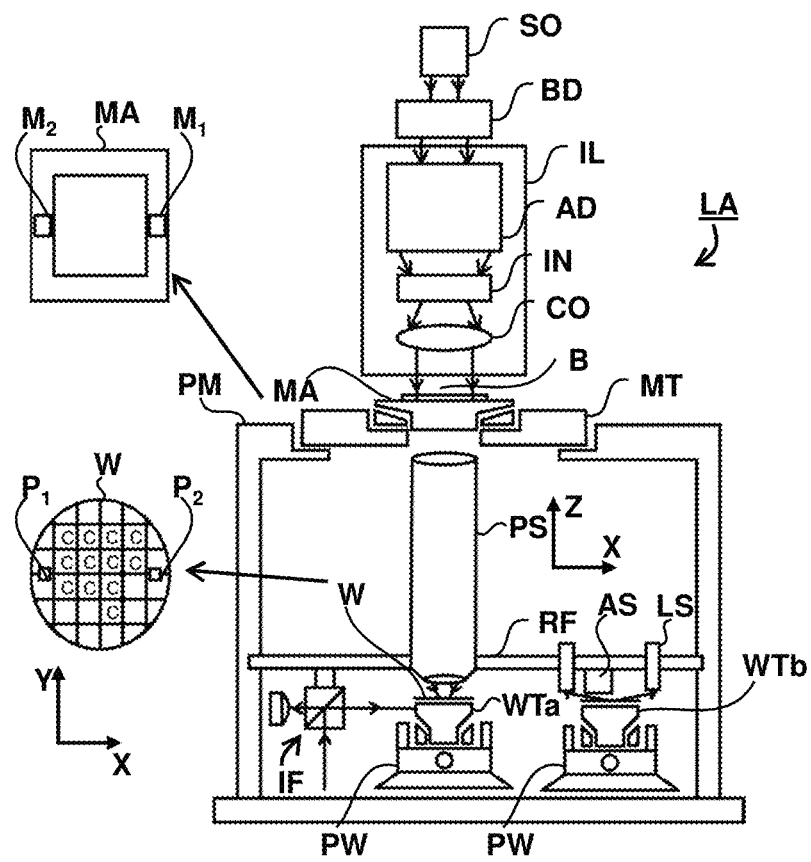
FIG. 16 is a schematic diagram of a lithographic projection apparatus, according to an embodiment.

FIG. 16 schematically depicts an exemplary lithographic projection apparatus whose illumination source could be optimized utilizing the methods described herein. The apparatus comprises:
- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 16 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 16. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 17:
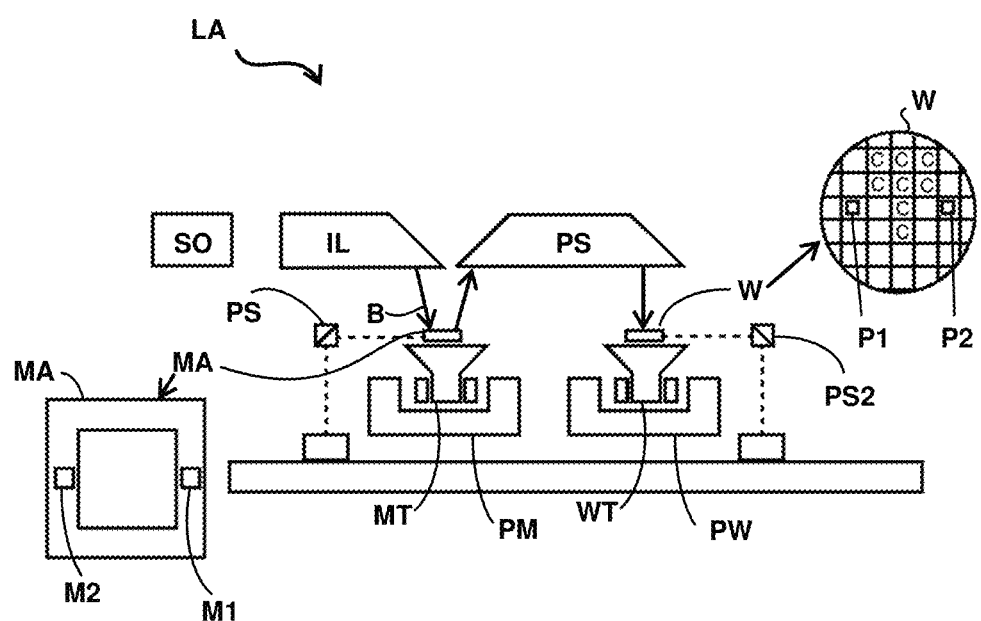
FIG. 17 is a schematic diagram of another lithographic projection apparatus, according to an embodiment.

FIG. 17 schematically depicts another exemplary lithographic projection apparatus 1000 whose illumination source could be optimized utilizing the methods described herein.

The lithographic projection apparatus 1000 includes:
a source collector module SO
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 17, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 17, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 18:
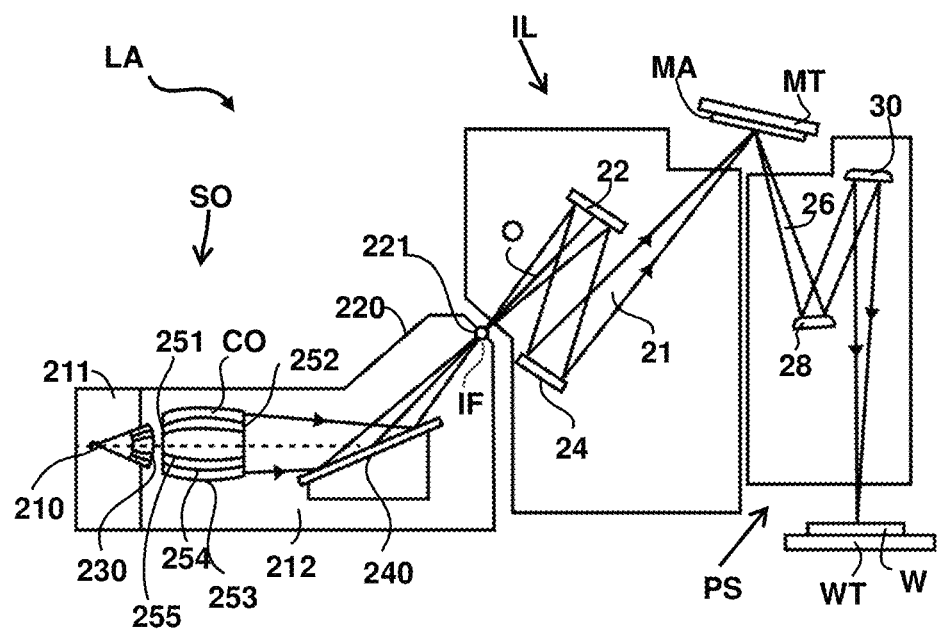
FIG. 18 is a more detailed view of the apparatus in FIG. 17, according to an embodiment.

FIG. 18 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 18.

Collector optic CO, as illustrated in FIG. 18, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 19:
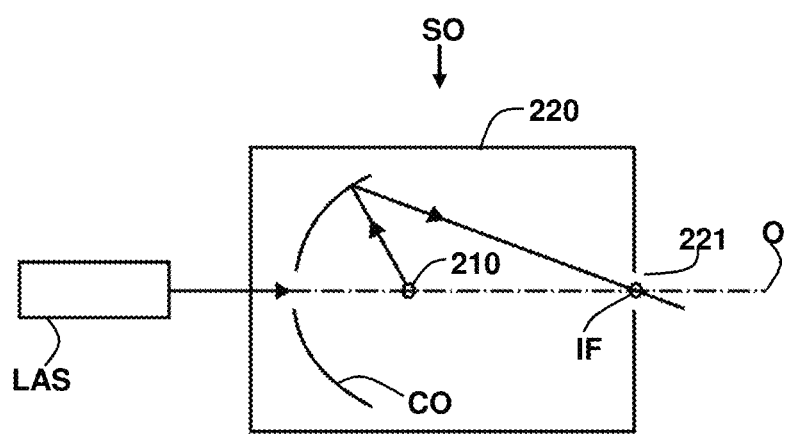
FIG. 19 is a more detailed view of the source collector module SO of the apparatus of FIGS. 17 and 18, according to an embodiment.

Alternatively, the source collector module SO may be part of an LPP radiation system as shown in FIG. 19. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining corrections to features of a mask used in a patterning process, the method comprising:

obtaining (i) a pattern group for a design layout, and (ii) defect inspection data of a substrate imaged using the mask used in the patterning process for the design layout;

determining, based on the defect inspection data, a defect map associated with the pattern group, wherein the defect map comprises locations of assist features having a relatively higher probability of being printed on the substrate compared to other patterns of the design layout; and determining, via simulating an optical proximity correction process using data associated with the defect map, corrections to the features of the mask.

2. The method of clause 1, wherein the determining the defect map comprises:

identifying a plurality of printed instances of the pattern group within the defect inspection data;

detecting assist features across the plurality of printed instances of the pattern group;

defining a grid for a printed instance of the plurality of printed instances of the pattern group; and determining, based on a location on the grid, a probability of occurrence of assist features at the location on the grid.

3. The method of clause 2, wherein the determining of the probability occurrence of assist features at the location comprises:

aligning the plurality of printed instances of the pattern group;

identifying a total number of assist features printed at the location on the grid of the printed pattern associated with the aligned plurality of printed instances, wherein the total number of the assist features printed at the location on the grid includes a total number of assist features detected, across the plurality of printed instances, at locations that correspond to the location on the grid; and determining the probability of occurrence of the assist features at the location on the grid, wherein the probability is determined based on the total number of the assist features printed or the total number of assist features detected.

4. The method of clause 3, wherein the probability of occurrence is determined based on a size of one or more assist features at a particular location on the grid, wherein a selected assist feature is at the particular location on the grid when the selected assist feature is at a location, across the plurality of printed instances, that corresponds to the particular location on the grid.

5. The method of clause 3, wherein the location on the grid is a region within the pattern group.

6. The method of any of clauses 1-5, further comprising:
obtaining metrology data of the substrate imaged using the mask used in the patterning process for the design layout;
determining, based on the metrology data, a variation of a metric associated with the pattern group; and
determining, via simulating an optical proximity correction process using data associated with the variation of the metric or the defect map, corrections to the features of the mask.

7. The method of clause 6, wherein the determining of the variation of the metric comprises:
identifying a plurality of printed instances of the pattern group within the metrology data;
aligning the plurality of printed instances of the pattern group; and
determining the variation of the metric associated with the pattern group.

8. The method of clause 6 or clause 7, wherein the metric is a critical dimension, line edge roughness, or a geometric property associated with a feature of the pattern group.

9. The method of any of clauses 6-8, wherein the metrology data is obtained via a metrology tool.

10. The method of clause 9, wherein the metrology tool is a scanning electron microscope (SEM) and the metrology data is a statistic obtained from a SEM image.

11. The method of clause 10, wherein the statistic is at least one of: a distribution of critical dimension (CD) values associated with the pattern group, a standard deviation of CD values associated with the pattern group, an edge variation band width associated with the pattern group, or a three-sigma variation of line roughness associated with the pattern group.

12. The method of any of clauses 1-11, wherein the data associated with the defect map is at least one of: a location of the defect on the defect map or the grid, a probability value of the defect at the location, or a size of the assist feature at the location.

13. The method of any of clauses 1-12, wherein the assist features associated with the pattern group has an increased probability of being printed when the probability is above a predetermined threshold.

14. The method of any of clauses 1-13, wherein the assist features associated with the pattern group has an increased probability of being printed when the probability is above a median or average probability of a reference group of assist features.

15. The method of any of clauses 1-14, wherein the assist features being printed on the substrate includes the assist features being printed on any of a plurality of layers manufactured on the substrate.

16. The method of any of clauses 1-15, wherein the grid is at least one of: a square grid, rectangular grid, a triangular grid, or a radial grid.

17. A computer program product comprising a non-transitory computer readable medium having instructions recorded thereon, the instructions when executed by a computer implementing the method of any of clauses 1-16.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method for determining corrections to features of a mask pattern used in a patterning process, the method comprising:
obtaining (i) a pattern group for a design layout, and (ii) defect inspection data of a substrate imaged using a mask used in the patterning process for the design layout;
determining, based on the defect inspection data, a defect map associated with the pattern group, wherein the defect map comprises locations of assist features having a relatively higher probability of being printed on the substrate compared to other patterns of the design layout,
wherein the determining the defect map comprises:
identifying a plurality of printed instances of the pattern group within the defect inspection data;
detecting assist features that were printed across the plurality of printed instances of the pattern group;
defining a grid for a printed instance of the plurality of printed instances of the pattern group; and
determining, based on a location on the grid, a probability of occurrence of one or more assist features at the location on the grid; and
determining, via computer simulating an optical proximity correction process using data associated with the defect map, one or more corrections to features of the mask pattern.

2. The method of claim 1, wherein the determining of the probability of occurrence of one or more assist features at the location comprises:
aligning the plurality of printed instances of the pattern group;
identifying a total number of assist features printed at the location on the grid associated with the aligned plurality of printed instances, wherein the total number of the assist features printed at the location on the grid includes a total number of assist features detected, across the plurality of printed instances, at locations that correspond to the location on the grid; and
determining the probability of occurrence of the one or more assist features at the location, wherein the probability is determined based on the total number of the assist features printed or the total number of assist features detected.

3. The method of claim 2, wherein the probability of occurrence is determined based on a size of one or more assist features at a particular location on the grid, wherein a selected assist feature is at the particular location on the grid when the selected assist feature is at a location, across the plurality of printed instances, that corresponds to the particular location on the grid.

4. The method of claim 2, wherein the location on the grid is a region within the pattern group.

5. The method of claim 1, further comprising:
obtaining metrology data of the substrate imaged using the mask used in the patterning process for the design layout;
determining, based on the metrology data, a variation of a metric associated with the pattern group; and
determining, via simulating an optical proximity correction process using data associated with the variation of the metric or the defect map, one or more corrections to features of the mask pattern.

6. The method of claim 5, wherein the determining of the variation of the metric comprises:
identifying a plurality of printed instances of the pattern group within the metrology data;
aligning the plurality of printed instances of the pattern group; and
determining the variation of the metric associated with the pattern group.

7. The method of claim 5, wherein the metric is critical dimension, line edge roughness, or a geometric property associated with a feature of the pattern group.

8. The method of claim 5, wherein the metrology data is obtained via a metrology tool.

9. The method of claim 8, wherein the metrology tool is a scanning electron microscope (SEM) and the metrology data is a statistic obtained from a SEM image.

10. The method of claim 9, wherein the statistic is at least one selected from: a distribution of critical dimension (CD) values associated with the pattern group, a standard deviation of CD values associated with the pattern group, an edge variation band width associated with the pattern group, or a three-sigma variation of line roughness associated with the pattern group.

11. The method of claim 1, wherein the data associated with the defect map is at least one selected from: a location of a defect on the defect map or the grid, a probability value of a defect at the location, or a size of an assist feature at the location.

12. The method of claim 1, wherein one or more assist features associated with the pattern group has an increased probability of being printed when the probability is above a predetermined threshold.

13. The method of claim 1, wherein one or more assist features associated with the pattern group has an increased probability of being printed when the probability is above a median or average probability of a reference group of one or more assist features.

14. The method of claim 1, wherein the assist features being printed on the substrate includes assist features being printed on any of a plurality of layers manufactured on the substrate.

15. A computer program product comprising a non-transitory computer readable medium having instructions therein, the instructions, upon execution by a computer system, configured to cause the computer system to at least:
obtain (i) a pattern group for a design layout, and (ii) defect inspection data of a substrate imaged using a mask used in a patterning process for the design layout;
determine, based on the defect inspection data, a defect map associated with the pattern group, wherein the defect map comprises locations of assist features having a relatively higher probability of being printed on the substrate compared to other patterns of the design layout,
wherein the determination of the defect map comprises:
identification of a plurality of printed instances of the pattern group within the defect inspection data;
detection of assist features that were printed across the plurality of printed instances of the pattern group;
definition of a grid for a printed instance of the plurality of printed instances of the pattern group; and
determination, based on a location on the grid, a probability of occurrence of one or more assist features at the location on the grid; and
determine, via simulation of an optical proximity correction process using data associated with the defect map, one or more corrections to features of a mask pattern.

16. The computer program product of claim 15, wherein the probability of occurrence is determined based on a size of one or more assist features at a particular location on the grid, wherein a selected assist feature is at the particular location on the grid when the selected assist feature is at a location, across the plurality of printed instances, that corresponds to the particular location on the grid.

17. The computer program product of claim 16, wherein the location on the grid is a region within the pattern group.

18. The computer program product of claim 15, wherein the instructions are further configured to cause the computer system to:
obtain metrology data of the substrate imaged using the mask used in the patterning process for the design layout;
determine, based on the metrology data, a variation of a metric associated with the pattern group; and
determine, via simulation of an optical proximity correction process using data associated with the variation of the metric or the defect map, one or more corrections to features of the mask pattern.

19. The computer program product of claim 15, wherein the data associated with the defect map is at least one selected from: a location of a defect on the defect map or the grid, a probability value of a defect at the location, or a size of an assist feature at the location.

20. The computer program product of claim 15, wherein one or more assist features associated with the pattern group has an increased probability of being printed when the probability is above a predetermined threshold or when the probability is above a median or average probability of a reference group of one or more assist features.

* * * * *